(12) United States Patent
Reznicek et al.

(10) Patent No.: US 11,489,045 B2
(45) Date of Patent: Nov. 1, 2022

(54) NANOSHEET TRANSISTOR WITH BODY CONTACT

(71) Applicant: INTERNATIONAL BUSINESS MACHINES CORPORATION, Armonk, NY (US)

(72) Inventors: Alexander Reznicek, Troy, NY (US); Ruilong Xie, Niskayuna, NY (US); Bahman Hekmatshoartabari, White Plains, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/301,229

(22) Filed: Mar. 30, 2021

(65) Prior Publication Data
US 2022/0320282 A1  Oct. 6, 2022

(51) Int. Cl.
*H01L 29/06* (2006.01)
*H01L 29/10* (2006.01)
(Continued)

(52) U.S. Cl.
CPC ...... *H01L 29/0673* (2013.01); *H01L 29/1033* (2013.01); *H01L 29/66795* (2013.01); *H01L 29/785* (2013.01); *H01L 2029/7858* (2013.01)

(58) Field of Classification Search
CPC ........... H01L 29/78696; H01L 29/0673; H01L 29/42392
See application file for complete search history.

(56) References Cited

U.S. PATENT DOCUMENTS

| 4,082,087 A | 4/1978 | Howson |
| 6,177,708 B1 | 1/2001 | Kuang |

(Continued)

FOREIGN PATENT DOCUMENTS

KR  101112431 B1  1/2012

OTHER PUBLICATIONS

Assaderaghi et al., "A Novel Silicon-On-Insulator (SOI) MOSFET for Ultra Low Voltage Operation", 1994 IEEE Symposium on Low Power Electronics, 6.3, pp. 58-59.
(Continued)

*Primary Examiner* — Changhyun Yi
(74) *Attorney, Agent, or Firm* — L. Jeffrey Kelly

(57) ABSTRACT

Semiconductor channel layers vertically aligned and stacked, separated by a work function metal and a gate dielectric partially surrounding and physically separating the work function metal from each, a first portion of the work function metal directly contacts a vertical sidewall of each layer. A first set and a second set of semiconductor channel layers vertically aligned and stacked, separated by a work function metal, a gate dielectric partially surrounding and physically separating the work function metal from each, a first portion of the work function metal between the first set and the second set directly contacts a sidewall of each layer. Forming an initial stack of alternating layers of a sacrificial and a semiconductor channel vertically aligned and stacked, forming a vertical opening creating a first stack of nanosheet layers and a second stack of nanosheet layers, and exposing vertical side surfaces of the alternating layers of both stacks.

14 Claims, 25 Drawing Sheets

Section Y-Y

(51) Int. Cl.
     *H01L 29/66*     (2006.01)
     *H01L 29/78*     (2006.01)

(56) References Cited

U.S. PATENT DOCUMENTS

| | | |
|---|---|---|
| 8,735,993 B2 | 5/2014 | Lo |
| 2006/0011977 A1 | 1/2006 | Kondo |
| 2007/0120254 A1 | 5/2007 | Hurkx |
| 2018/0254329 A1 | 9/2018 | Guillorn |
| 2018/0331179 A1 | 11/2018 | Cheng |
| 2019/0035888 A1 | 1/2019 | Wu |
| 2019/0058052 A1 | 2/2019 | Frougier |
| 2019/0096996 A1* | 3/2019 | Song ............... H01L 29/401 |
| 2020/0035786 A1 | 1/2020 | Xie |
| 2020/0105751 A1 | 4/2020 | Dewey |
| 2021/0082766 A1 | 3/2021 | Miura |

OTHER PUBLICATIONS

Drake et al., "Analysis of the Impact of Gate-Body Signal Phase on DTMOS Inverters in 0 . 1 3 P~D-SOI", 2003 IEEE, pp. 99-100.
Pending U.S. Appl. No. 16/728,462, filed Dec. 27, 2019, entitled: "Nanosheet With Buried Gate Contact", 43 pages.
Notification of Transmittal of the International Search Report and the Written Opinion of the International Searching Authority, or the Declaration, dated Jul. 19, 2022, International application No. PCT/EP2022/058312, 17 pages.

* cited by examiner

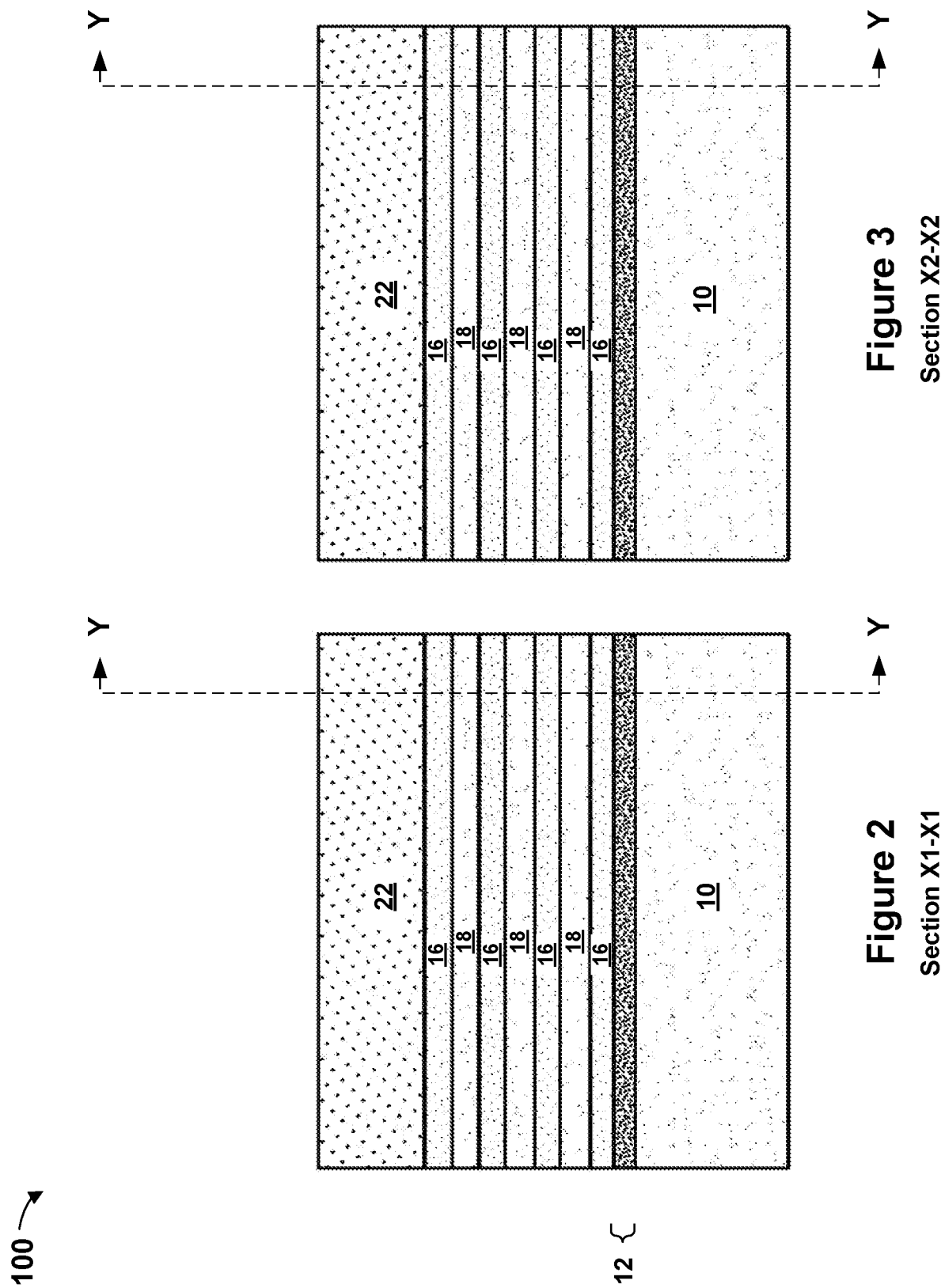

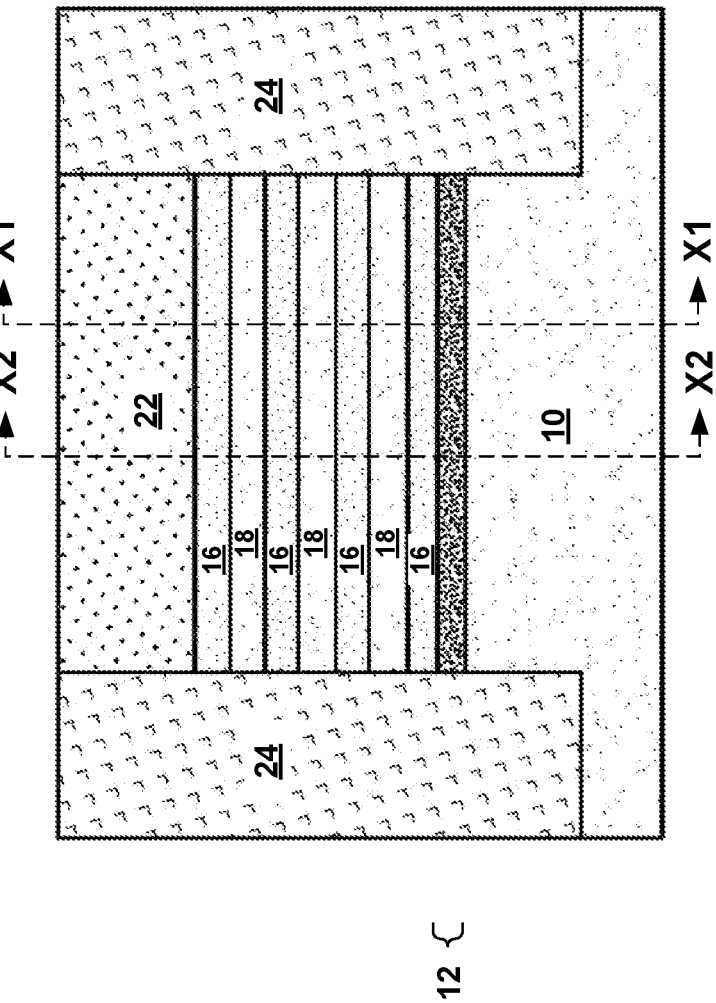

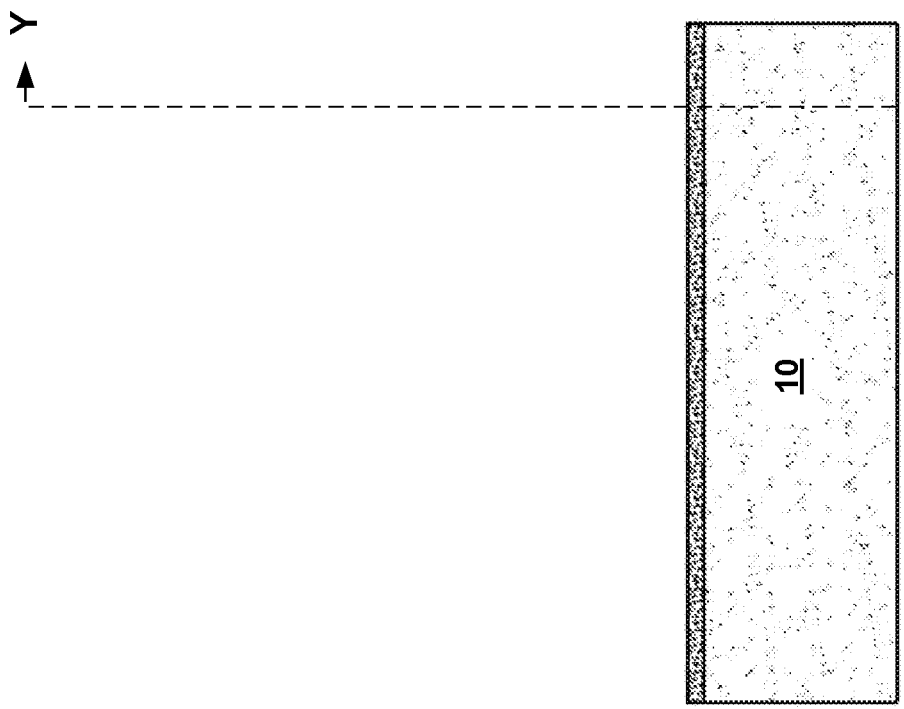
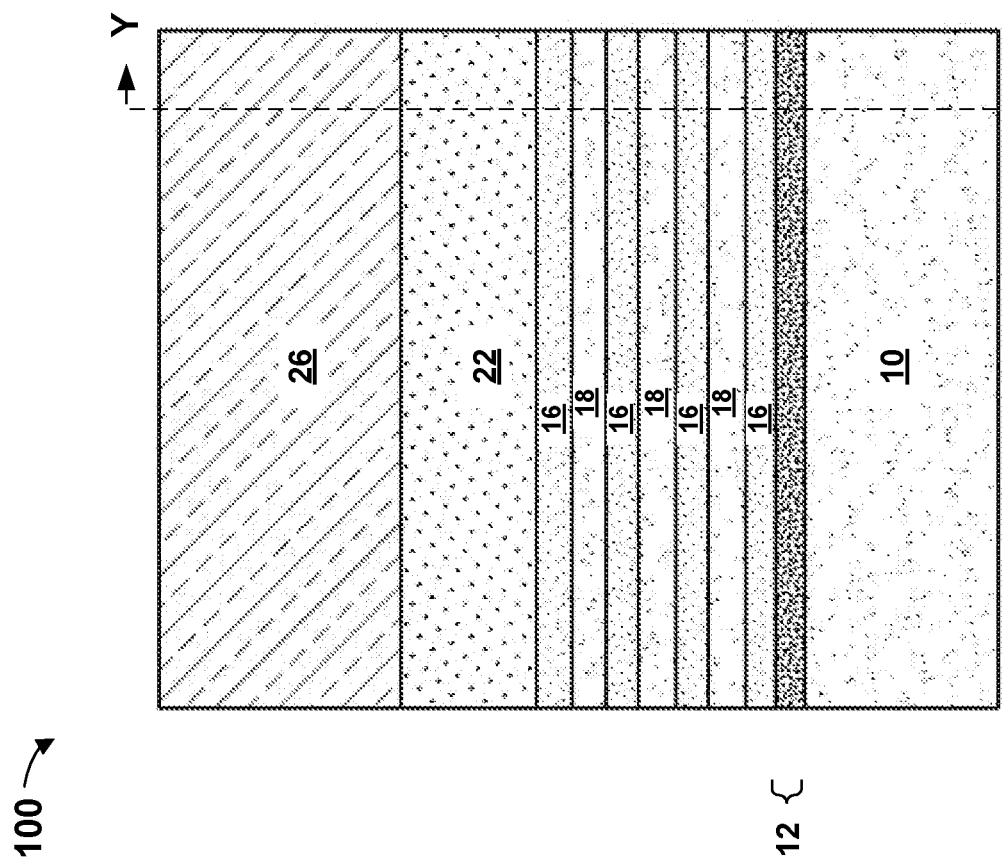

Section Y-Y

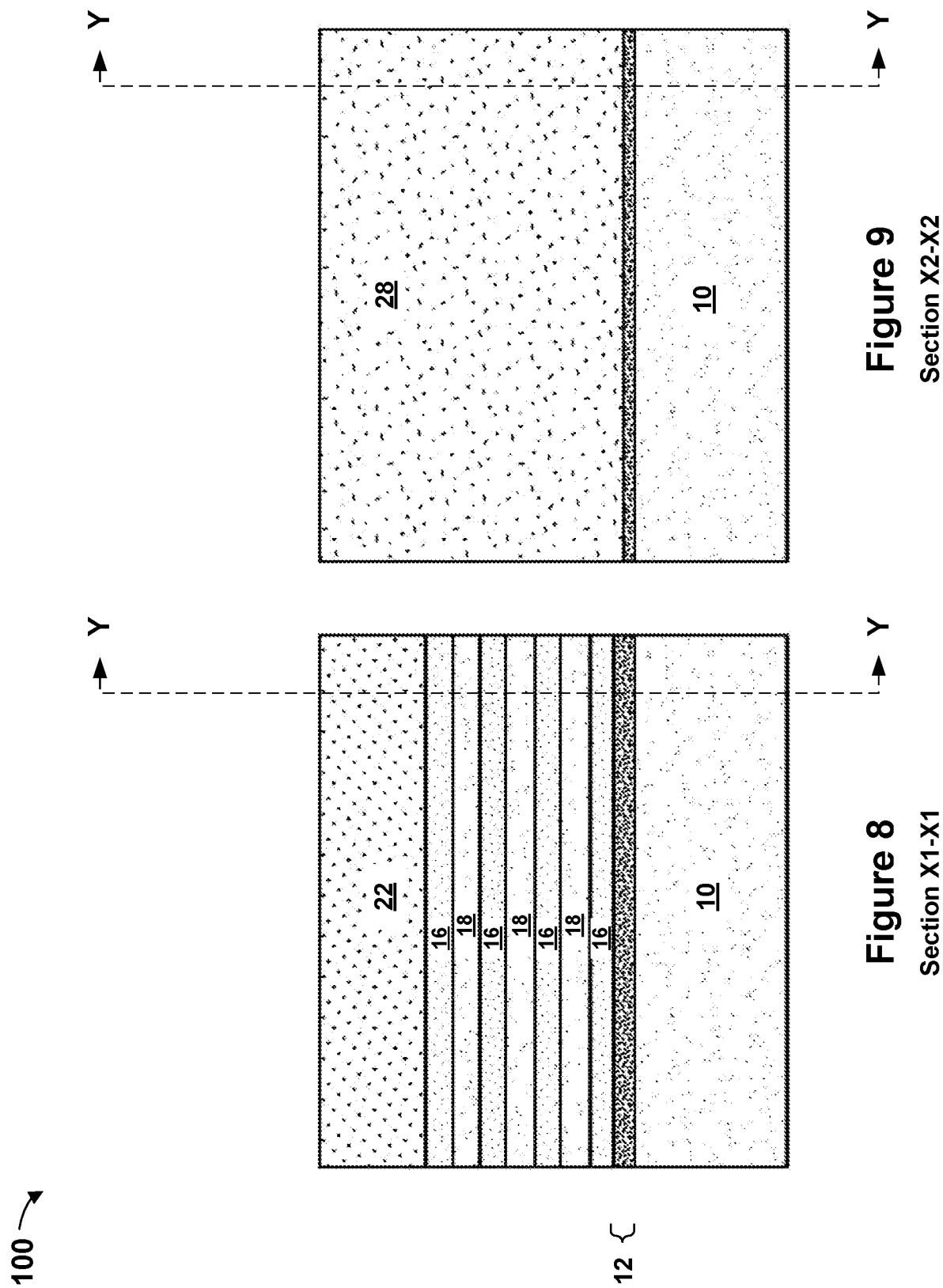

Section Y-Y

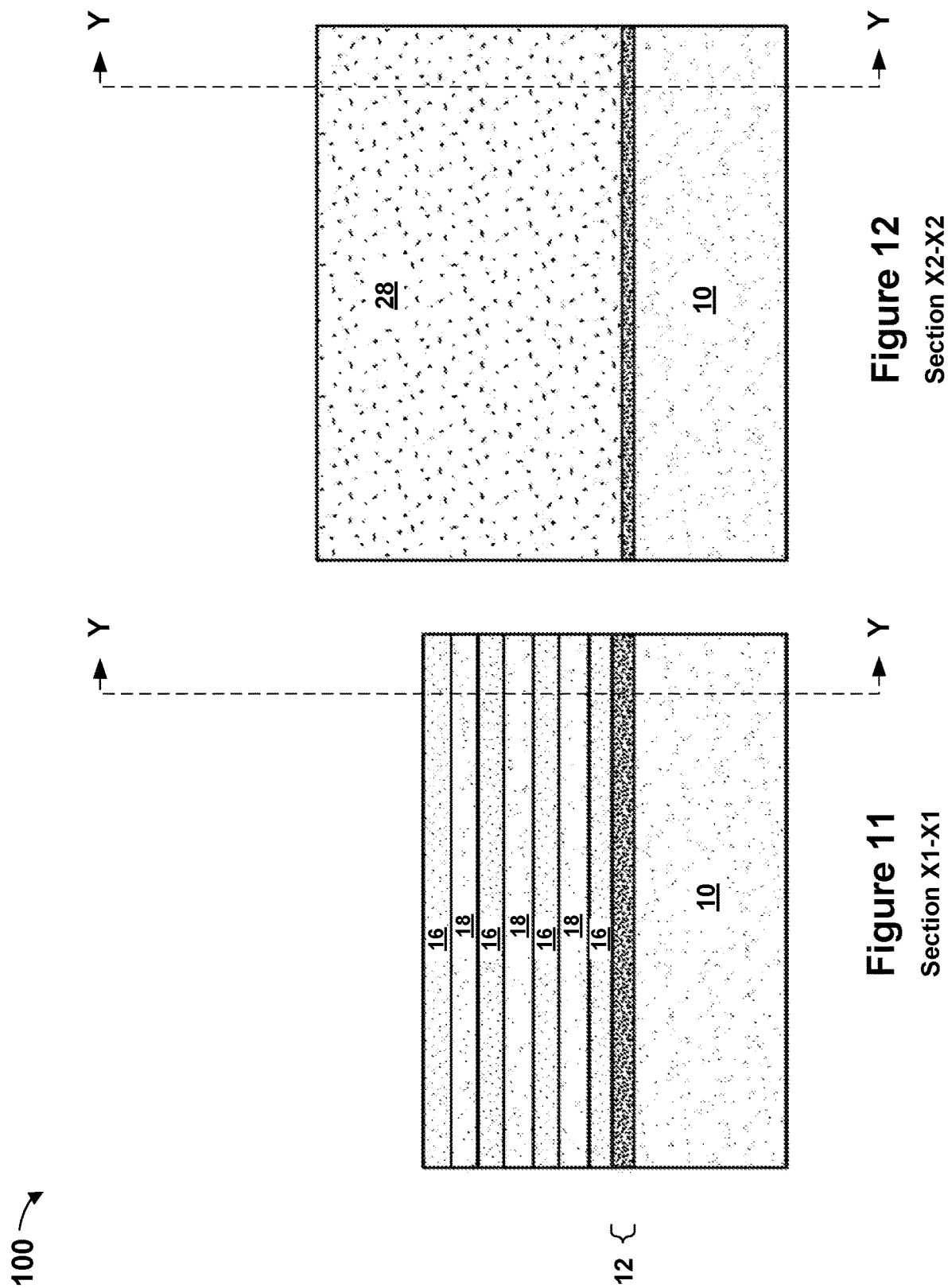

Section Y-Y

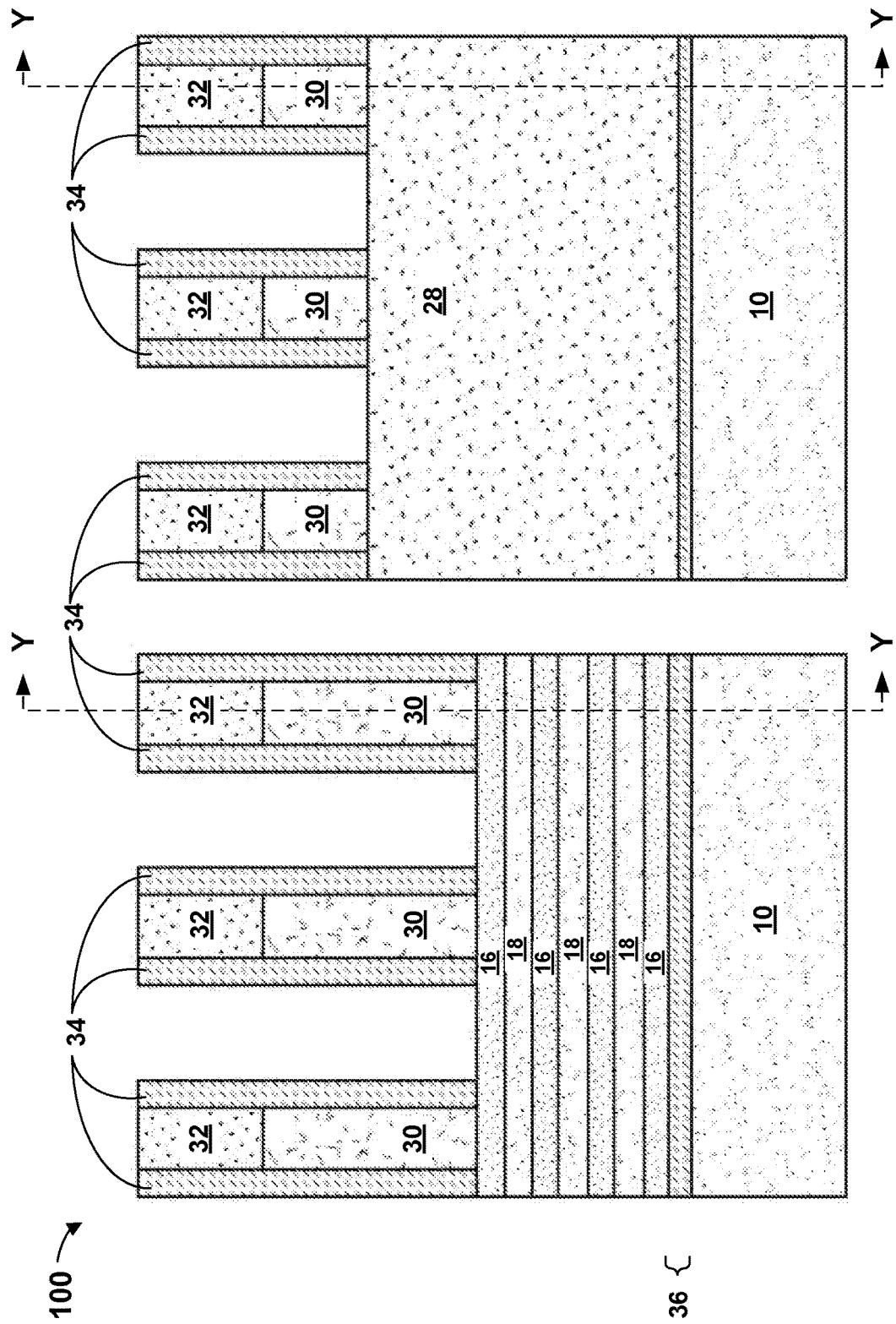

Section Y-Y

Section X1-X1

Section X2-X2

Section Y-Y

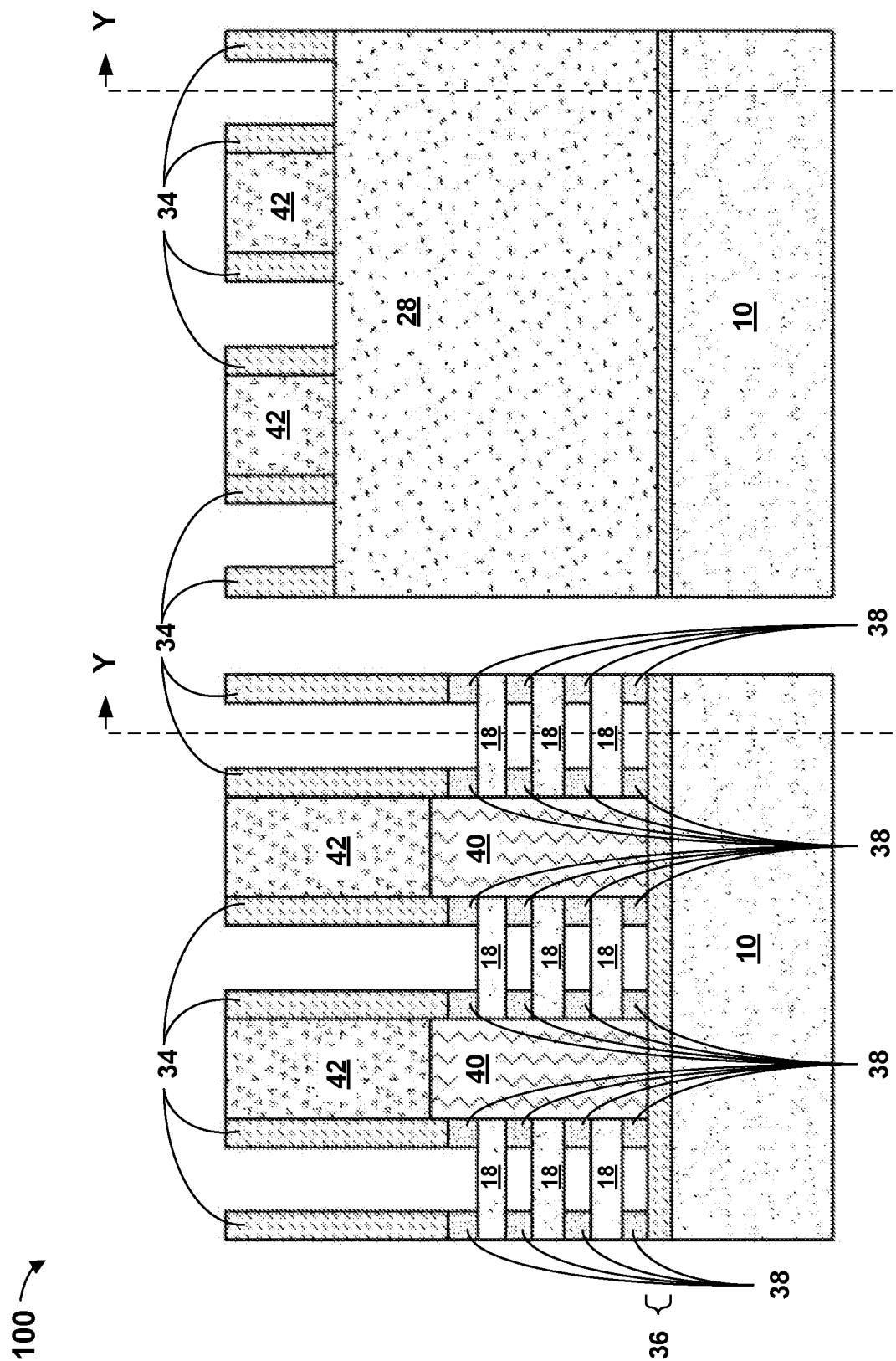

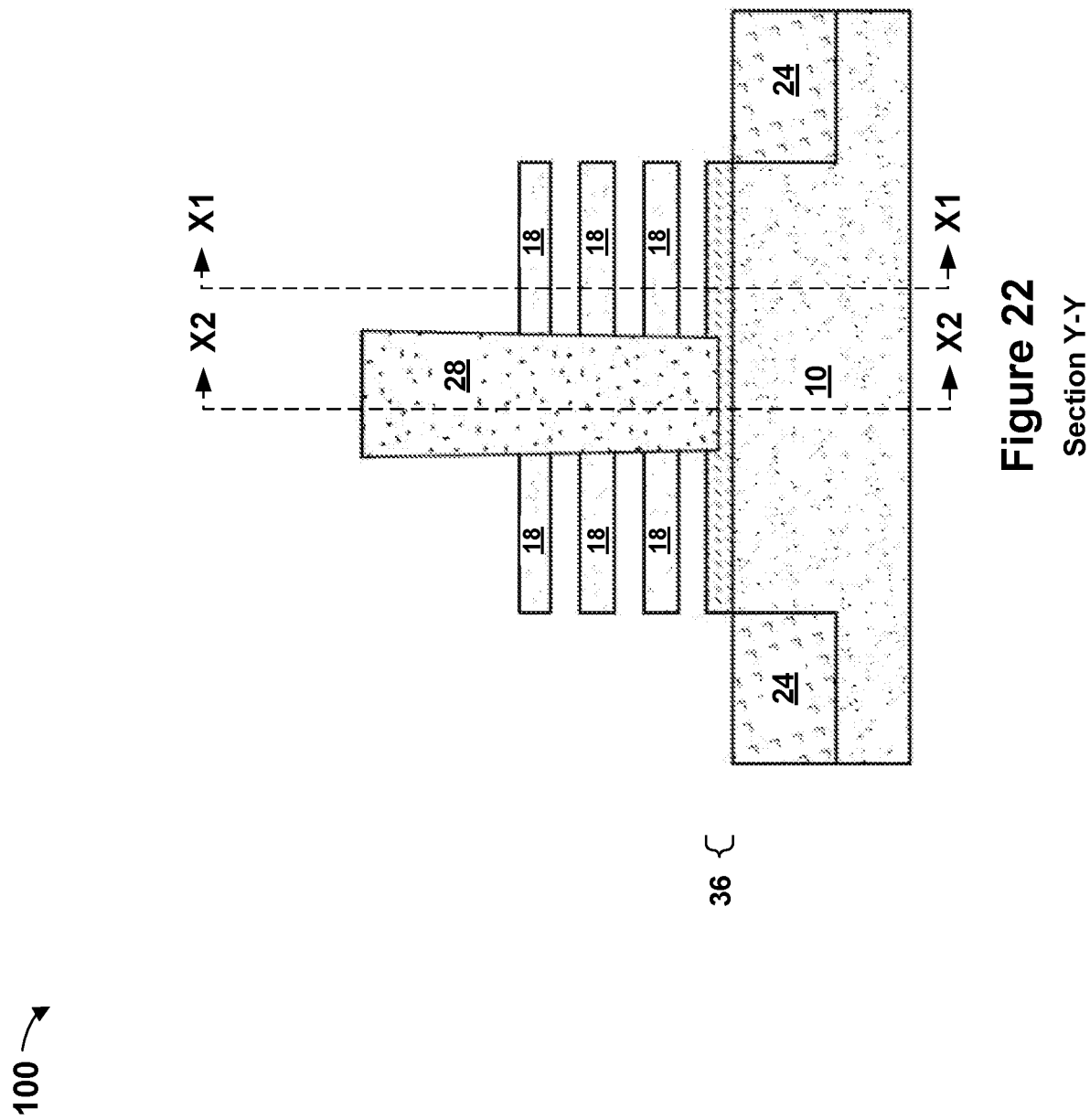

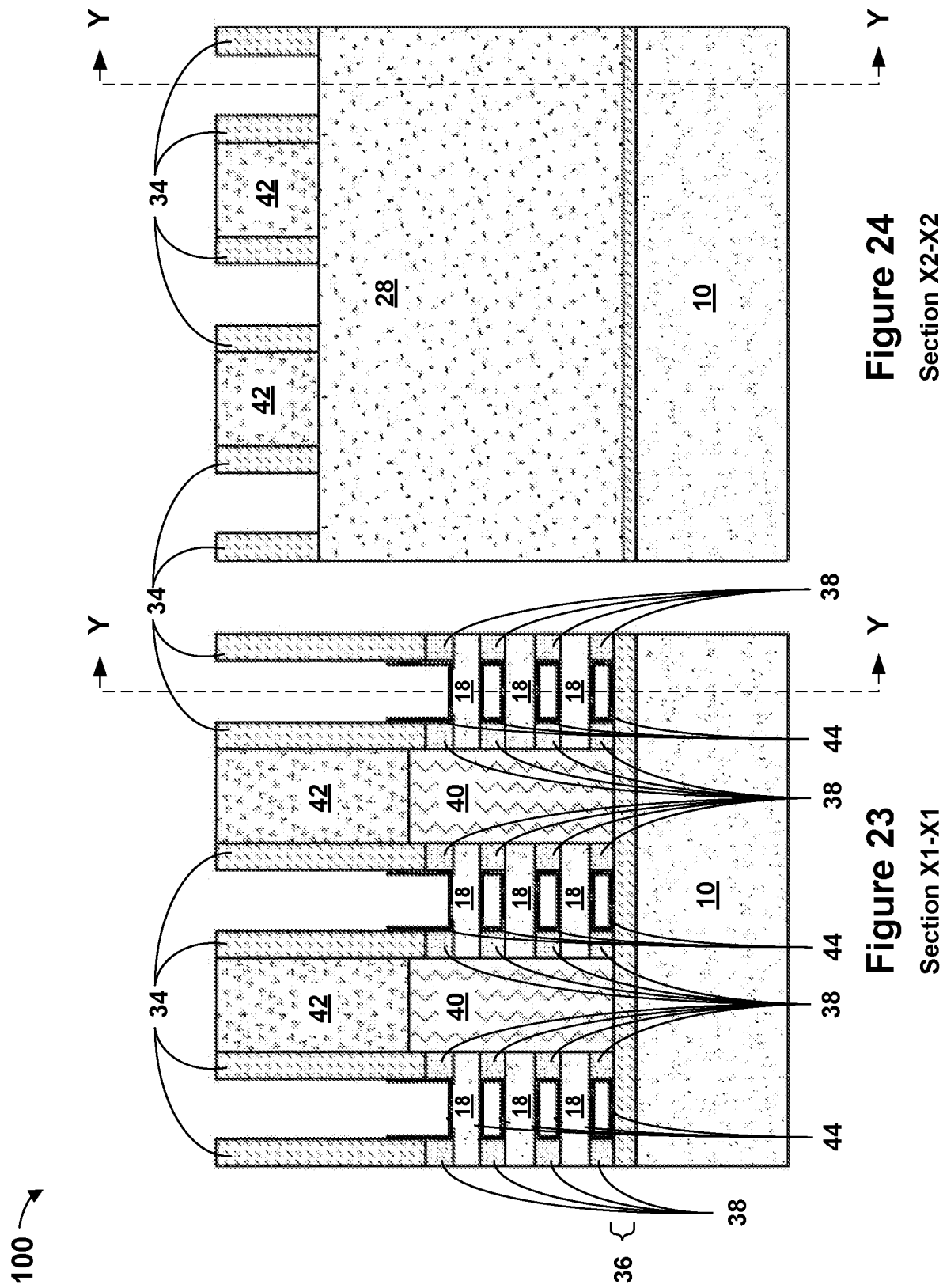

Section Y-Y

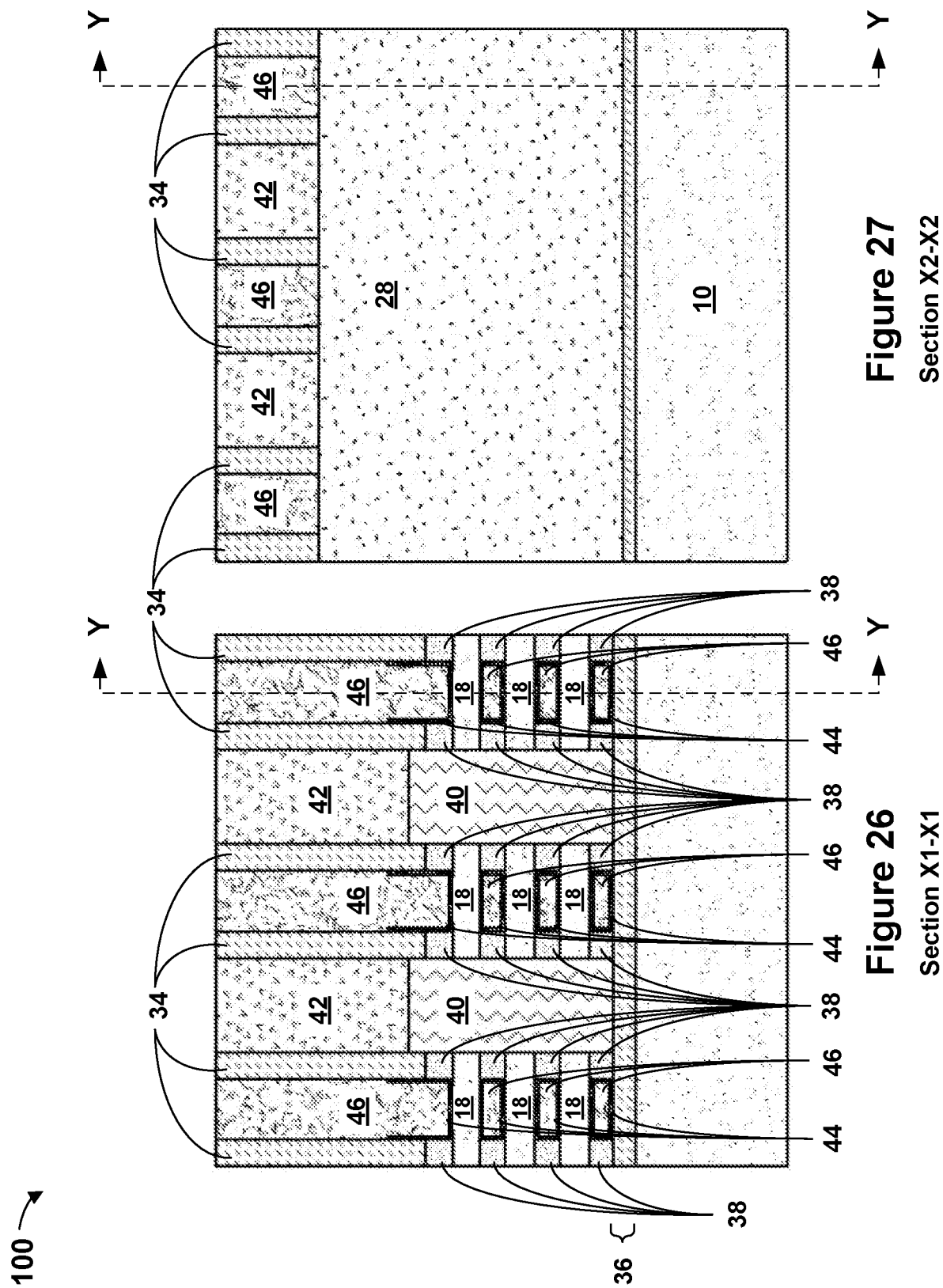

Section Y-Y

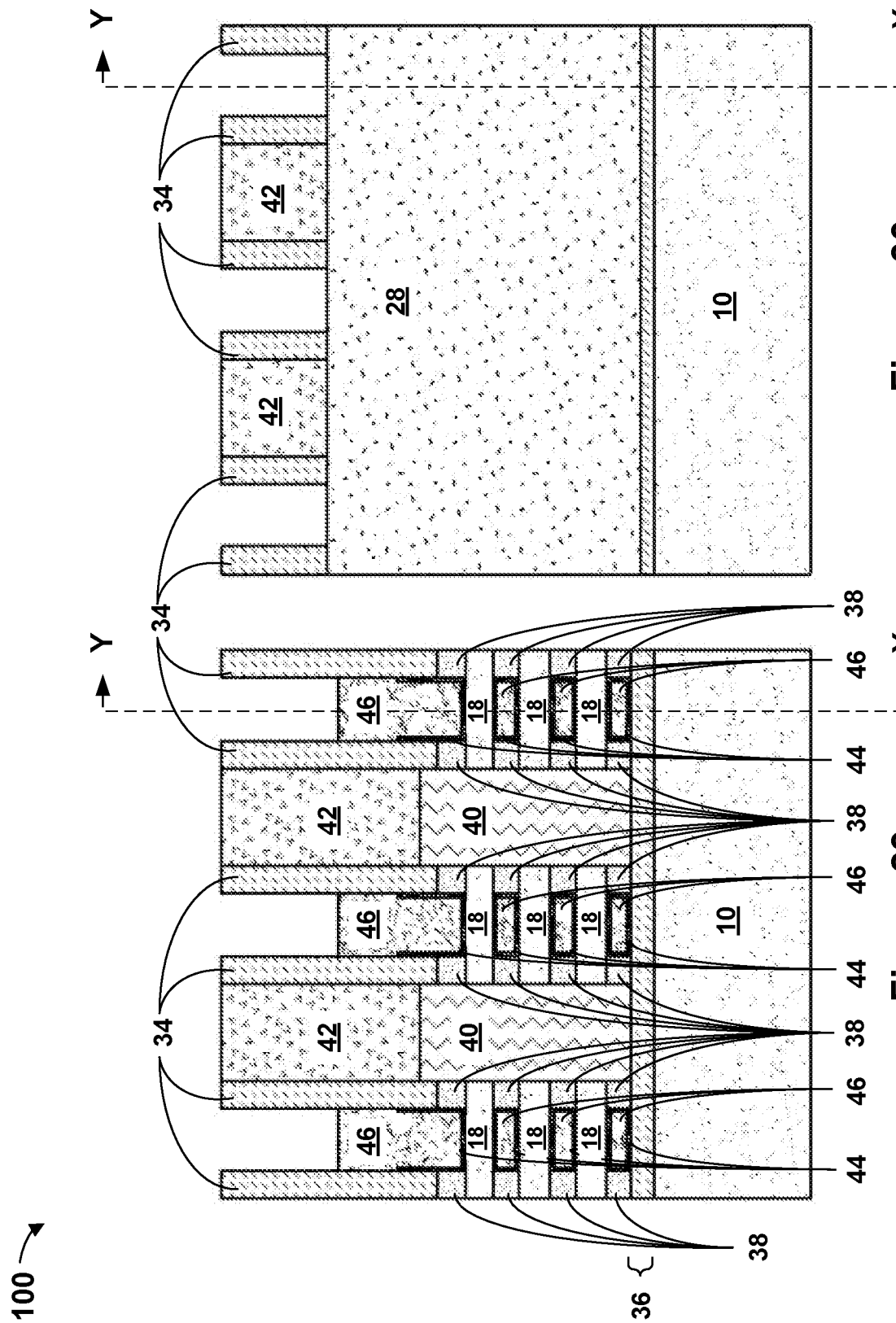

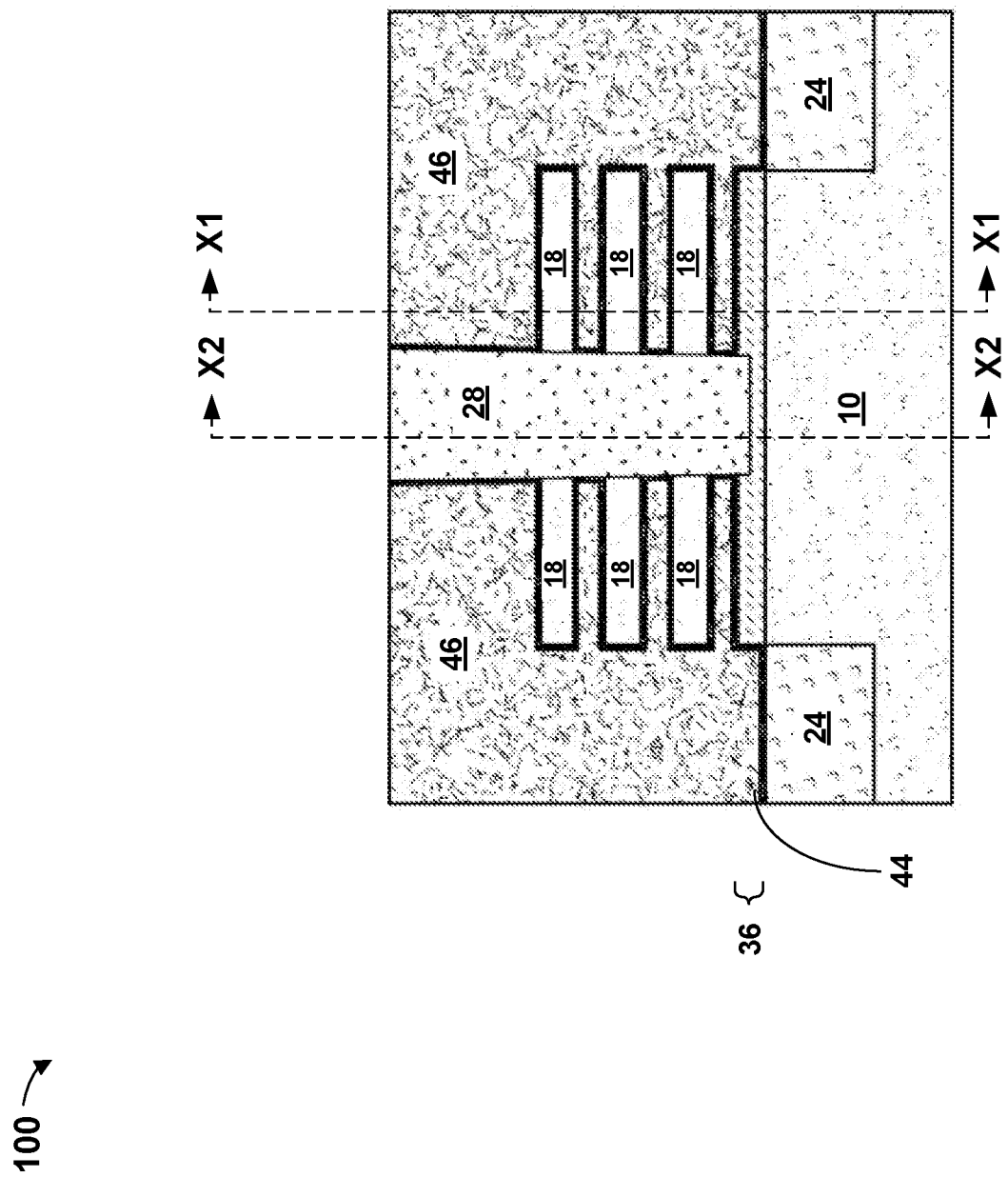

Section X1-X1

Section X2-X2

Section Y-Y

Section X1-X1

Section X2-X2

Section Y-Y

NANOSHEET TRANSISTOR WITH BODY CONTACT

BACKGROUND

The present invention relates, generally, to the field of semiconductor manufacturing, and more particularly to fabricating a nanosheet field effect transistor with dynamic threshold voltage control.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of nanosheets extending between a pair of source/drain epitaxial regions. The device may be a gate all around transistor in which a gate surrounds at least a portion of the nanosheet channel.

The threshold voltage of an FET is typically determined by properties of a composition of a work function metal used in the FET, along with various other device/material properties including but not limited to channel doping, growth conditions of a high-k dielectric, charge distribution within the high-k dielectric, spacing of high-k/channel interface, presence and properties of interfacial oxide formed between the high-k and the channel. It would be advantageous to fabricate a nanosheet FET device with a dynamic threshold voltage control.

SUMMARY

According to an embodiment, a semiconductor nanosheet device is provided. The semiconductor nanosheet device including semiconductor channel layers vertically aligned and stacked one on top of another, the semiconductor channel layers separated from each other by a work function metal and a gate dielectric layer partially surrounding each of the semiconductor channel layers and physically separating the work function metal from each of the semiconductor channel layers, where a first portion of the work function metal directly contacts a vertical sidewall of each of the semiconductor channel layers.

According to an embodiment, a semiconductor device is provided. The semiconductor device including a first set of semiconductor channel layers vertically aligned and stacked one on top of another separated by a work function metal, a second set of semiconductor channel layers adjacent to the first set of semiconductor channel layers, the second set of semiconductor channel layers are vertically aligned and stacked one on top of another separated by the work function metal, and a gate dielectric layer partially surrounding each of the semiconductor channel layers and physically separating the work function metal from each of the semiconductor channel layers, where a first portion of the work function metal between the first set of semiconductor channel layers and the second set of semiconductor channel layers directly contacts a sidewall of each of the semiconductor channel layers of both the first set and the second set of semiconductor channel layers.

According to an embodiment, a method is provided. The method including forming an initial stack of nanosheet layers on a substrate, the stack of nanosheet layers including alternating layers of a sacrificial and a semiconductor channel vertically aligned and stacked one on top of another, and forming a vertical opening along a length of the initial stack of nanosheet layers creating a first stack of nanosheet layers and a second stack of nanosheet layers, the vertical opening exposing vertical side surfaces of the alternating sacrificial layers and the semiconductor channel layers of both the first stack and the second stack.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIGS. 2, 3 and 4 each illustrate a cross-sectional view of the semiconductor structure of FIG. 1 along sections X1-X1, X2-X2 and Y-Y, respectively, FIGS. 2 and 3 are parallel to each other, and FIG. 4 is perpendicular to FIGS. 2 and 3, according to an exemplary embodiment;

FIGS. 5, 6 and 7 each illustrate a cross-sectional view of the of the semiconductor structure along sections X1-X1, X2-X2 and Y-Y, respectively, and illustrates selective removal of semiconductor material layers, according to an exemplary embodiment;

FIGS. 8, 9 and 10 each illustrate a cross-sectional view of the of the semiconductor structure along sections X1-X1, X2-X2 and Y-Y, respectively, and illustrates formation of a dielectric, according to an exemplary embodiment;

FIGS. 11, 12 and 13 each illustrate a cross-sectional view of the of the semiconductor structure along sections X1-X1, X2-X2 and Y-Y, respectively, and illustrates removal of a hard mask, according to an exemplary embodiment;

FIGS. 14, 15 and 16 each illustrate a cross-sectional view of the of the semiconductor structure along sections X1-X1, X2-X2 and Y-Y, respectively, and illustrates formation of a sacrificial gate, according to an exemplary embodiment;

FIGS. 20, 21 and 22 each illustrate a cross-sectional view of the of the semiconductor structure along sections X1-X1, X2-X2 and Y-Y, respectively, and illustrates removal of the sacrificial gate, according to an exemplary embodiment;

FIGS. 23, 24 and 25 each illustrate a cross-sectional view of the of the semiconductor structure along sections X1-X1, X2-X2 and Y-Y, respectively, and illustrates formation of a high-k liner, according to an exemplary embodiment;

FIGS. 26, 27 and 28 each illustrate a cross-sectional view of the of the semiconductor structure along sections X1-X1, X2-X2 and Y-Y, respectively, and illustrates formation of a work function metal layer, according to an exemplary embodiment;

FIGS. 29, 30 and 31 each illustrate a cross-sectional view of the of the semiconductor structure along sections X1-X1, X2-X2 and Y-Y, respectively, and illustrates a partial removal of the work function metal layer, according to an exemplary embodiment;

Figure 1:
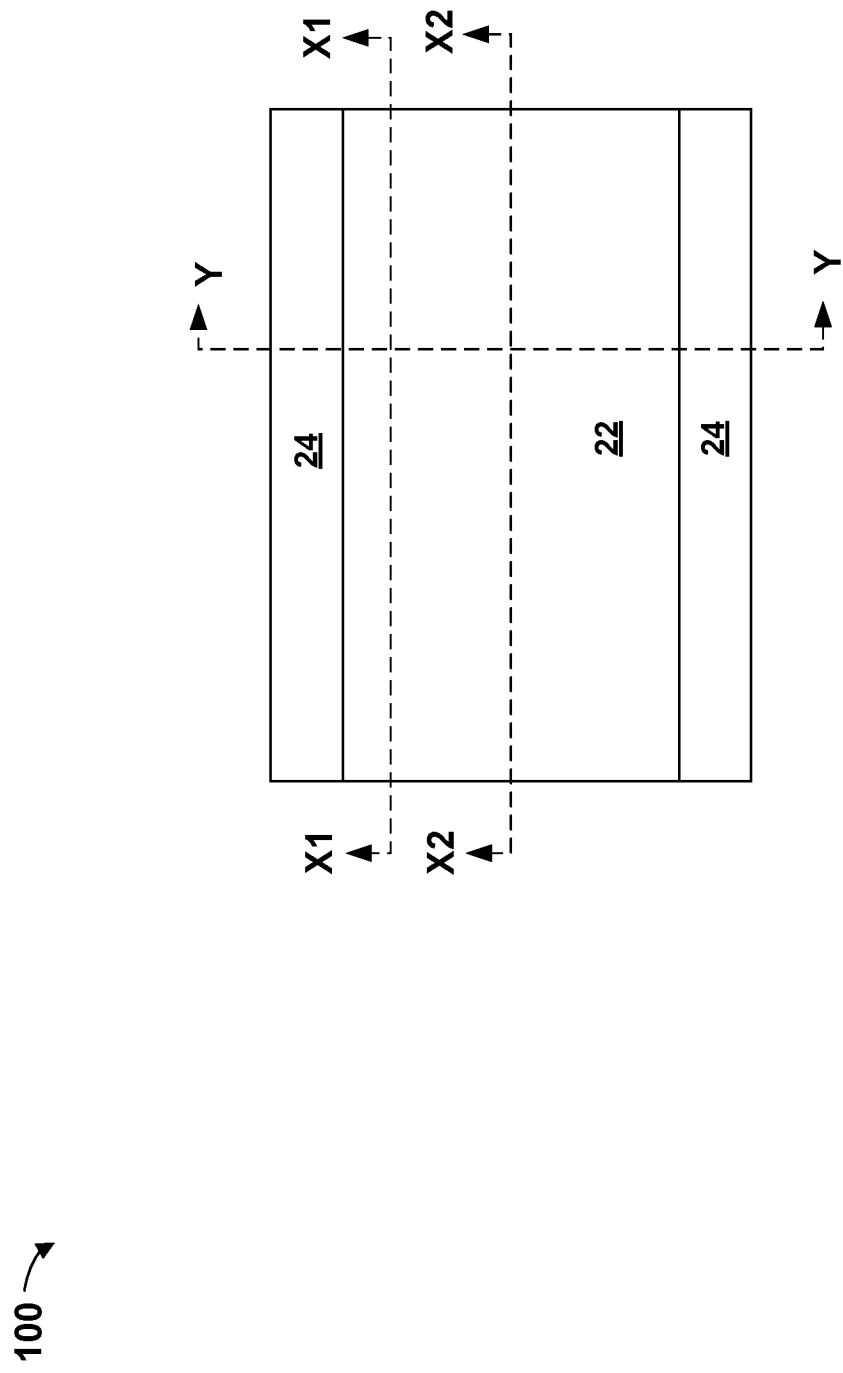
FIG. 1 illustrates a top view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon and silicon germanium, which are then formed into nanosheets. A gate all around structure may be formed on all vertical sides and on a horizontal top surface of a section of the nanosheets. Source-drain structures may be formed at the opposite ends of the nanosheet structures.

The present invention relates, generally, to the field of semiconductor manufacturing, and more particularly to fabricating a nanosheet FET with dynamic threshold voltage control.

The threshold voltage of a nanosheet FET is determined by properties of a composition of a work function metal used in the FET, along with various other device/material properties including but not limited to channel doping, growth conditions of a high-k dielectric, charge distribution within the high-k dielectric, spacing of high-k/channel interface, presence and properties of interfacial oxide formed between high-k and channel. In an embodiment, when fabricating a nanosheet FET, all parts of the nanosheet FET may be fabricated at the same time with the same materials, and control of a threshold voltage for different nanosheet FET may be managed by using different work function metals for different voltage thresholds.

Alternating layers of a sacrificial semiconductor material and semiconductor channel material may be formed and then formed into parallel nanosheet stacks. A lengthwise opening may be formed in a nanosheet stack running a length of the nanosheet stack and exposing inner side surfaces of the alternating layers of a sacrificial semiconductor material and semiconductor channel material of the nanosheet stack. The lengthwise opening divides the nanosheet stack into two nanosheet stacks, each of which will subsequently formed into a transistor. The lengthwise opening is filled with a dielectric. A sacrificial gate may be formed over the nanosheet stack, perpendicular to a length of the nanosheet stack. A portion of the nanosheet stack may be removed between adjacent sacrificial gates. A portion of the sacrificial semiconductor material layers of the nanosheet stack may be removed adjacent to where the portion of the nanosheet stack was removed, along with a lateral portion of the dielectric. An inner spacer may be formed where the portion of the sacrificial semiconductor material layers were removed. A source drain may be formed at the ends of the nanosheet stacks. The sacrificial gate may be removed and a remaining portion of sacrificial semiconductor material layers of the nanosheet stack may be removed. A gate dielectric or high-k liner may be formed surrounding openings where the sacrificial material layers were removed and on exposed surfaces of the dielectric. A work function metal may be formed, filling the openings where the sacrificial material layers were removed and where the sacrificial gate was removed. The work function metal may be recessed. A portion of the high-k liner may be removed where exposed over the dielectric and openings may be formed in the dielectric. The opening in the dielectric may be where the lengthwise opening was formed between two neighboring stacks of the nanosheet intersects a position of the gate which is running perpendicular to the lengthwise opening. Formation of additional work function metal may be formed in the opening in the dielectric and also where the work function metal was recessed. The additional work function metal will have direct contact to a sidewall of the semiconductor channel material. This direct contact may be referred to as a body contact. The resulting structure may be a gate with direct contact to the nanosheet which extends vertically from the gate over the nanosheet to an isolation layer below the nanosheet. This provides a direct contact to the semiconductor channel material layers of the nanosheet without a high-k liner between the work function metal and the semiconductor channel material layers.

The direct contact forms a variable threshold voltage field-effect transistor (VTFET), also known as a dynamic threshold voltage FET. As explained above, the threshold voltage of a transistor is set by various device and material properties during device fabrication. This threshold voltage may be referred to as an as-fabricated threshold voltage, or a threshold voltage at no bias. During the operation of a variable (dynamic) threshold voltage FET, the threshold voltage is reduced below its as-fabricated value as the gate potential (and therefore the body potential) is increased. As a result, the drive current of the transistor is increased.

Further advantages of the direct contact include maintaining the design compactness of a nanosheet without increasing device area. The body direct can also mitigate the floating-body effects associated with partially depleted nanosheet channels.

Embodiments of the present invention disclose a structure and a method of forming a nanosheet FET with dynamic threshold voltage control are described in detail below by referring to the accompanying drawings in FIGS. 1-37, in accordance with an illustrative embodiment.

Referring now to FIGS. 1-4, a semiconductor structure 100 (hereinafter "structure") at an intermediate stage of fabrication is shown according to an exemplary embodiment. FIG. 1 is a top view of the structure 100. FIGS. 2 and 3 are each a cross-sectional view of the structure 100 along section lines X1-X1 and X2-X2, respectively and are parallel to each other. FIG. 4 is a cross-sectional view of the structure 100 along section line Y-Y and is perpendicular to section lines X1-X1 and X2-X2. Section line Y-Y is parallel with subsequently formed gate lines. The structure 100 of FIGS. 1-4 may be formed or provided.

The structure 100 may include alternating layers of sacrificial semiconductor material and semiconductor channel material stacked one on top of another, covered by a hard mask 22 on a substrate 10. It should be noted that, while a limited number of alternating layers are depicted, any number of alternating layers may be formed.

The substrate 10 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 10 may be approximately, but is not limited to, several hundred microns thick. In other embodiments, the substrate 10 may be a layered semiconductor such as a silicon-on-insulator or SiGe-on-insulator, where a buried insulator layer, separates a base substrate from a top semiconductor layer.

The alternating layers of sacrificial semiconductor material and semiconductor channel material may include a nanosheet stack sacrificial layer 12 (hereinafter "stack sacrificial layer") on the substrate 10, covered by a sacrificial semiconductor material layer 16 (hereinafter "sacrificial layer"), covered by a semiconductor channel material layer 18 (hereinafter "channel layer"), covered by a sacrificial layer 16, covered by a channel layer 18, covered by a sacrificial layer 16, covered by a channel layer 18, covered by a sacrificial layer 16. The hard mask 22 may cover the uppermost sacrificial layer 16.

The stack sacrificial layer 12, may, for example, be silicon germanium with a germanium concentration about 60 atomic percent, although percentages greater than 60 atomic percent and less than 60 percent may be used. The stack sacrificial layer 12 can be formed using an epitaxial growth technique. The stack sacrificial layer 12 will subsequently be removed selective to the remaining alternating layers, as described below.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth of first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 16 is composed of a first semiconductor material which differs in composition from at least an upper portion of the substrate 10, the channel layers 18 and the stack sacrificial layer 12. In an embodiment, each sacrificial layer 16 may be a silicon-germanium semiconductor alloy and have a germanium concentration less than 50 atomic percent. In another example, each sacrificial layer 16 may have a germanium concentration ranging from about 20 atomic percent to about 40 atomic percent. Each sacrificial layer 16 can be formed using known deposition techniques or an epitaxial growth technique as described above.

Each channel layer 18 is composed of a second semiconductor material which differs in composition from at least the upper portion of the substrate 10, the sacrificial layers 16 and the stack sacrificial layer 12. Each channel layer 18 has a different etch rate than the first semiconductor material of sacrificial layer 16 and has a different etch rate than the stack sacrificial layer 12. The sacrificial layer 16 has a different etch rate than the stack sacrificial layer 12. The second semiconductor material can be, for example, silicon. The second semiconductor material, for each channel layer 18, can be formed using known deposition techniques or an epitaxial growth technique as described above.

The alternating layers of sacrificial layer 16, channel layer 18 and the stack sacrificial layer 12 can be formed by sequential epitaxial growth of the nanosheet stack sacrificial layer material and alternating layers of the first semiconductor material and the second semiconductor material.

The stack sacrificial layer 12 may have a thickness ranging from about 5 nm to about 15 nm. The sacrificial layers 16 may each have a thickness ranging from about 5 nm to about 12 nm, while the channel layers 18 may each have a thickness ranging from about 3 nm to about 12 nm. Each sacrificial layer 16 may have a thickness that is the same as, or different from, a thickness of each channel material layer 18. In an embodiment, each sacrificial layer 16 has an identical thickness. In an embodiment, each channel layer 18 has an identical thickness.

The hard mask 22 may be formed over an upper horizontal surface of the stack sacrificial layer 12 and the alternating layers of sacrificial layers 16 and channel layers 18, by methods known in the art.

The stack sacrificial layer 12, the alternating layers of sacrificial layers 16 and channel layers 18, and the hard mask 22 may be formed into nanosheet stacks, each covered with the hard mask 22 by patterning the hard mask 22 and subsequent formation of a vertical trench, not shown, by removal of portions of each layer. The trench may be formed between each nanosheet stack by an anisotropic etching technique, such as, for example, reactive ion etching (RIE), and stopping on etching a portion of the substrate 10 for subsequent formation of a shallow trench isolation region (hereinafter "STI") 24 between each nanosheet stack.

As shown in FIG. 4, the STI 24 may be formed between adjacent nanosheet stacks in the trench, not shown, between adjacent nanosheet stacks. The STI 24 may formed on portions of a vertical side surface of the nanosheet stack.

The STI 24 may be a dielectric material and may be between adjacent nanosheet stacks and formed using known patterning and deposition techniques. Adjacent nanosheet stacks are isolated from one another by the STI 24. A lower horizontal surface and a portion of a side surface of the STI 24 may be adjacent to a lower horizontal surface and a vertical side surface of the substrate 10. The lower horizontal surface of the STI 24 may be below a lower horizontal surface of the stack sacrificial layer 12. The vertical side surface of the STI 24 may be adjacent to vertical side surfaces of the nanosheet stack, including vertical side surfaces of the stack sacrificial layer 12, the sacrificial layers 16, the channel layers 18 and the hard mask 22.

After forming the STI 24, a chemical mechanical polishing (CMP) technique may be used to remove excess material and polish upper surfaces of the structure 100 such that upper horizontal surfaces of the STI 24 and the hard mask 22 are coplanar.

Each nanosheet stack may include the stack sacrificial layer 12 covered by the alternating layers of sacrificial layers 16 and channel layers 18, covered by the hard mask 22. In FIGS. 1-4, and only by way of an example, the nanosheet stack includes four layers of sacrificial layers 16 alternating with three layers of the channel layers 18. The material stacks that can be employed in embodiments of the present invention are not limited to the specific embodiment illustrated in FIGS. 1-4. There may be any number of nanosheet stacks on the structure 100.

The nanosheet stack can include any number of sacrificial layers 16 and channel layers 18. The nanosheet stack is used to produce a gate all around device that includes vertically stacked semiconductor channel material nanosheets for a positive channel Field Effect Transistor (hereinafter "p-FET") or a negative channel Field Effect Transistor (hereinafter "n-FET") device.

Figure 7:
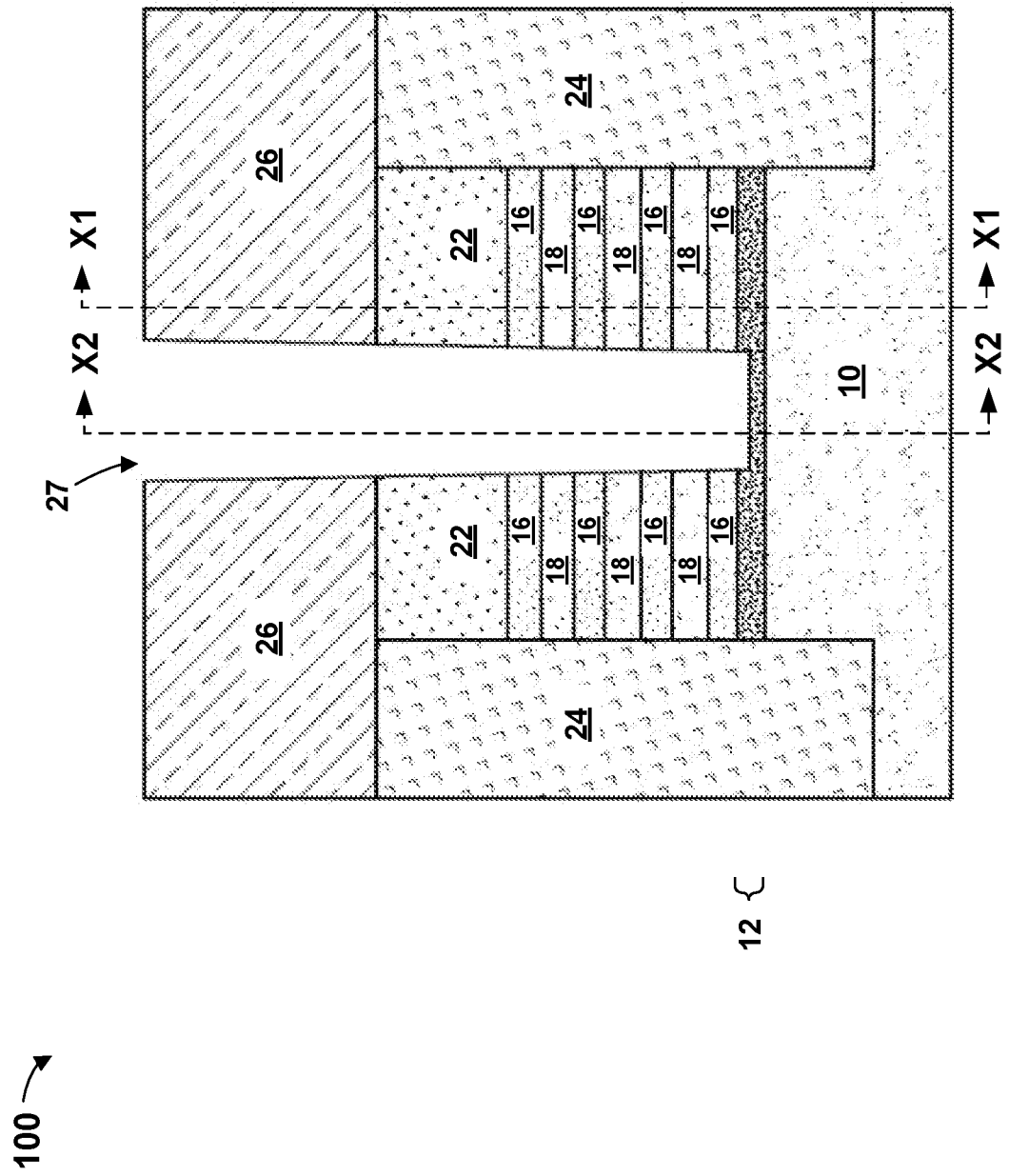

Referring now to FIGS. 5-7, the structure 100 is shown according to an exemplary embodiment. FIGS. 5 and 6 are each a cross-sectional view of the structure 100 along section lines X1-X1 and X2-X2, respectively and are parallel to each other. FIG. 7 is a cross-sectional view of the structure 100 along section line Y-Y and is perpendicular to section lines X1-X1 and X2-X2.

As shown in FIGS. 5-7, an organic planarization layer (hereinafter "OPL") 26 may be formed and a first opening 27 is be formed.

The OPL 26 is deposited over the hard mask 22 on the nanosheet stack and over the STI 24 surrounding the nanosheet stack. The OPL 26 may be formed by a blanket deposition using typical deposition techniques, for example spin-on coating. The OPL 26 can be a self-planarizing organic material that includes carbon, hydrogen, oxygen, and optionally nitrogen, fluorine, and silicon. The first OPL 26 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

After that, conventional lithography process is used to define the cut opening 27. The opening 27 may be made by removing portions of the OPL 26, portions of the hard mask 22 and portions of the nanosheet stack, including portions of the sacrificial layers 16, portions of the channel layers 18 and a portion of the stack sacrificial layer 12. The opening 27 may be formed using a combination of etching techniques to selectively remove portions of the OPL 26 selective to the hard mask 22 and may be done in multiple steps. Additional removal to form the opening 27 may be include removal using an anisotropic etching technique, such as, for example, reactive ion etching (RIE), and stopping at the stack sacrificial layer 12 for subsequent formation of direct contact within the nanosheet stack of the semiconductor channel material and the work function metal. In an embodiment, a lower horizontal portion of the opening 27 includes a remaining portion of the stack sacrificial layer 12.

The opening 27 may be created along the X2-X2 section line, along a length of the nanosheet stack, and may effectively divide the nanosheet stack in two, for subsequent formation of direct contact between the semiconductor channel material and the work function metal in the opening 27.

Figure 10:
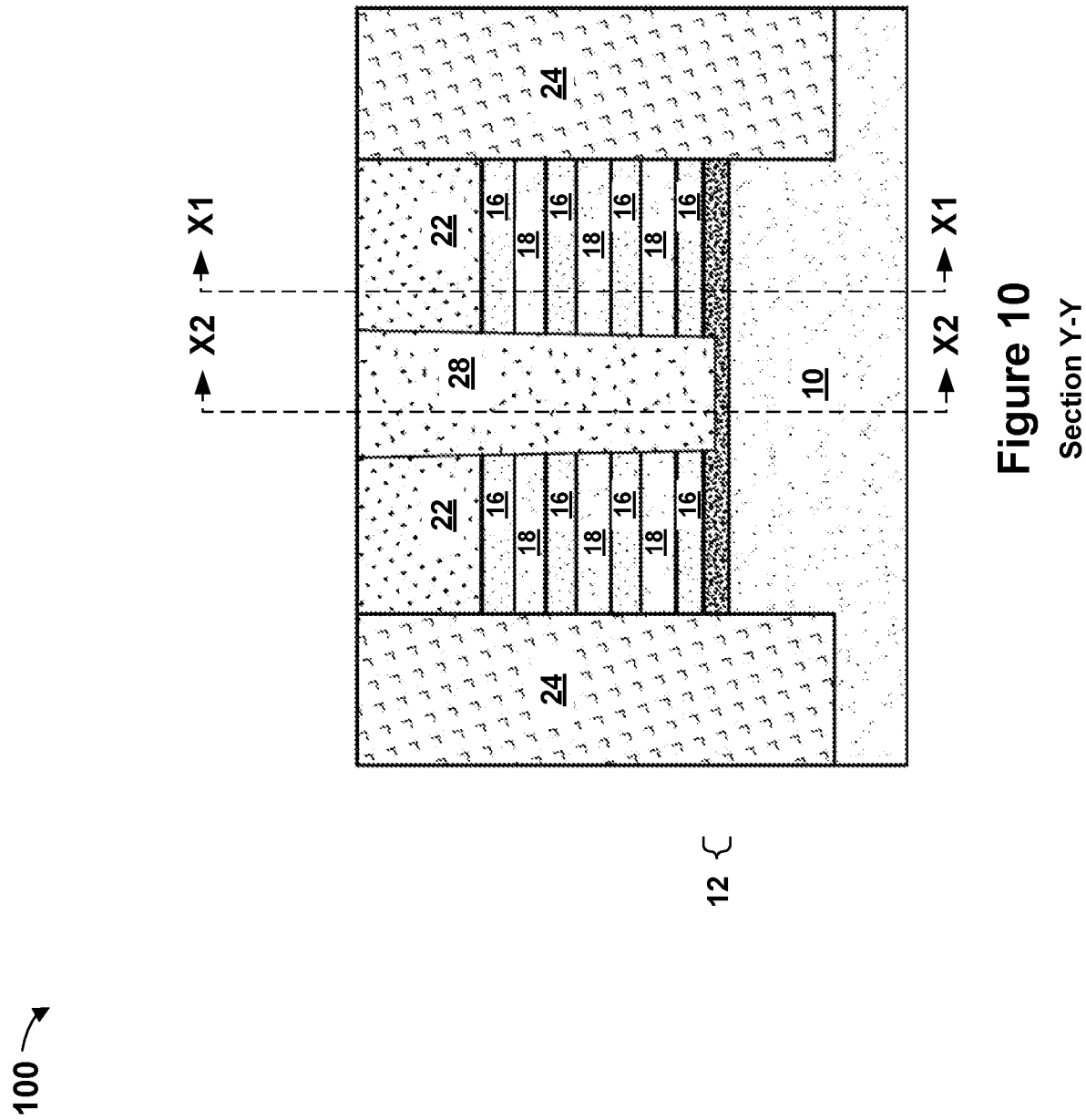

Referring now to FIGS. 8-10, the structure 100 is shown according to an exemplary embodiment. FIGS. 8 and 9 are each a cross-sectional view of the structure 100 along section lines X1-X1 and X2-X2, respectively and are parallel to each other. FIG. 10 is a cross-sectional view of the structure 100 along section line Y-Y and is perpendicular to section lines X1-X1 and X2-X2.

As shown in FIGS. 8-10, a dielectric 28 may be formed in the opening 27. The dielectric 28 may be formed by conformally depositing or growing a dielectric in the opening 27. The dielectric 28 may include any dielectric material such as silicon carbide, silicon oxide carbide or silicon oxide carbon nitride, and may include a single layer or may include multiple layers of dielectric material. The material used for the dielectric 28 may be selected which is able to be selectively removed to both silicon oxide and silicon nitride.

The dielectric 28 may fill the opening 27. A lower horizontal surface of the dielectric 28 may be adjacent to an upper horizontal surface of the stack sacrificial layer 12 in the opening 27. Vertical side surfaces of the dielectric 28 may be adjacent to vertical side surfaces of a portion of the stack sacrificial layer 12, vertical side surfaces of the sacrificial layers 16, vertical side surfaces of the channel layers 18 and vertical side surfaces of the hard mask 22. Portions of the dielectric 28 may be removed via a standard etch such that upper horizontal surfaces of the dielectric 28 and the hard mask 22 are coplanar.

Figure 13:
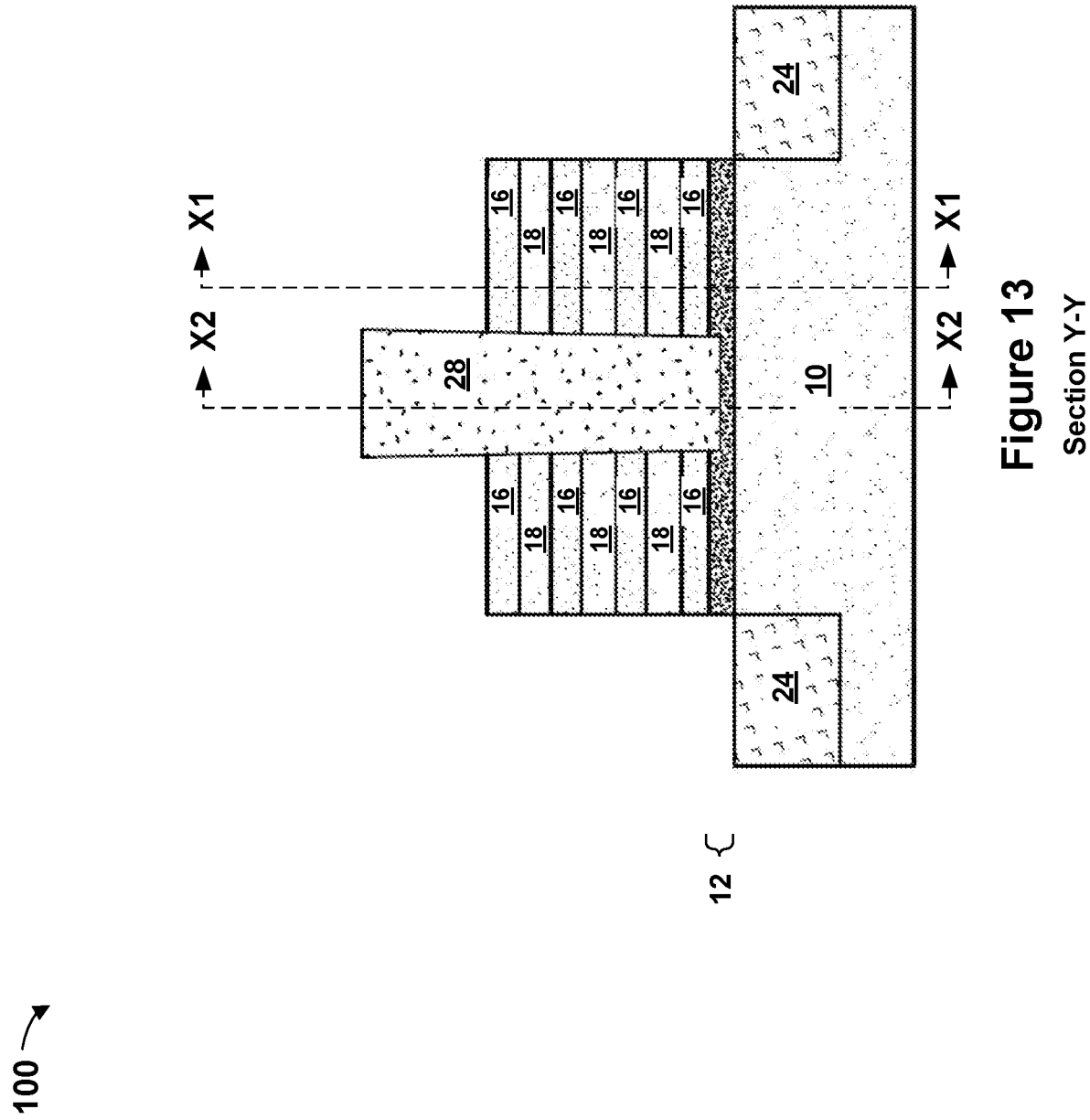

Referring now to FIGS. 11-13, the structure 100 is shown according to an exemplary embodiment. FIGS. 11 and 12 are each a cross-sectional view of the structure 100 along section lines X1-X1 and X2-X2, respectively and are parallel to each other. FIG. 13 is a cross-sectional view of the structure 100 along section line Y-Y and is perpendicular to section lines X1-X1 and X2-X2.

As shown in FIGS. 11-13, the hard mask 22 and a portion of the STI 24 may be removed. The hard mask 22 and the portion of the STI 24 may be selectively removed using a combination of etching techniques to selectively remove the hard mask 22 and the STI 24 selective to the dielectric 28, the stack sacrificial layer 12, the channel layers 18 and the stack sacrificial layers 16, and may be done in multiple steps. A remaining portion of the STI 24 may be embedded in the substrate 10. An upper surface of the remaining portion of the STI 24 may align with the lower horizontal surface of the stack sacrificial layer 12.

Removal of the hard mask 22 and the STI 24 may expose an upper horizontal surface of an uppermost sacrificial layer 16 of the nanosheet stack, and may expose a portion of vertical side surfaces of the dielectric 28 above the nanosheet stack. Vertical side surfaces of the nanosheet stack, including vertical side surfaces of the stack sacrificial layer 12, the channel layers 18 and the stack sacrificial layers 16 may be exposed.

Figure 16:
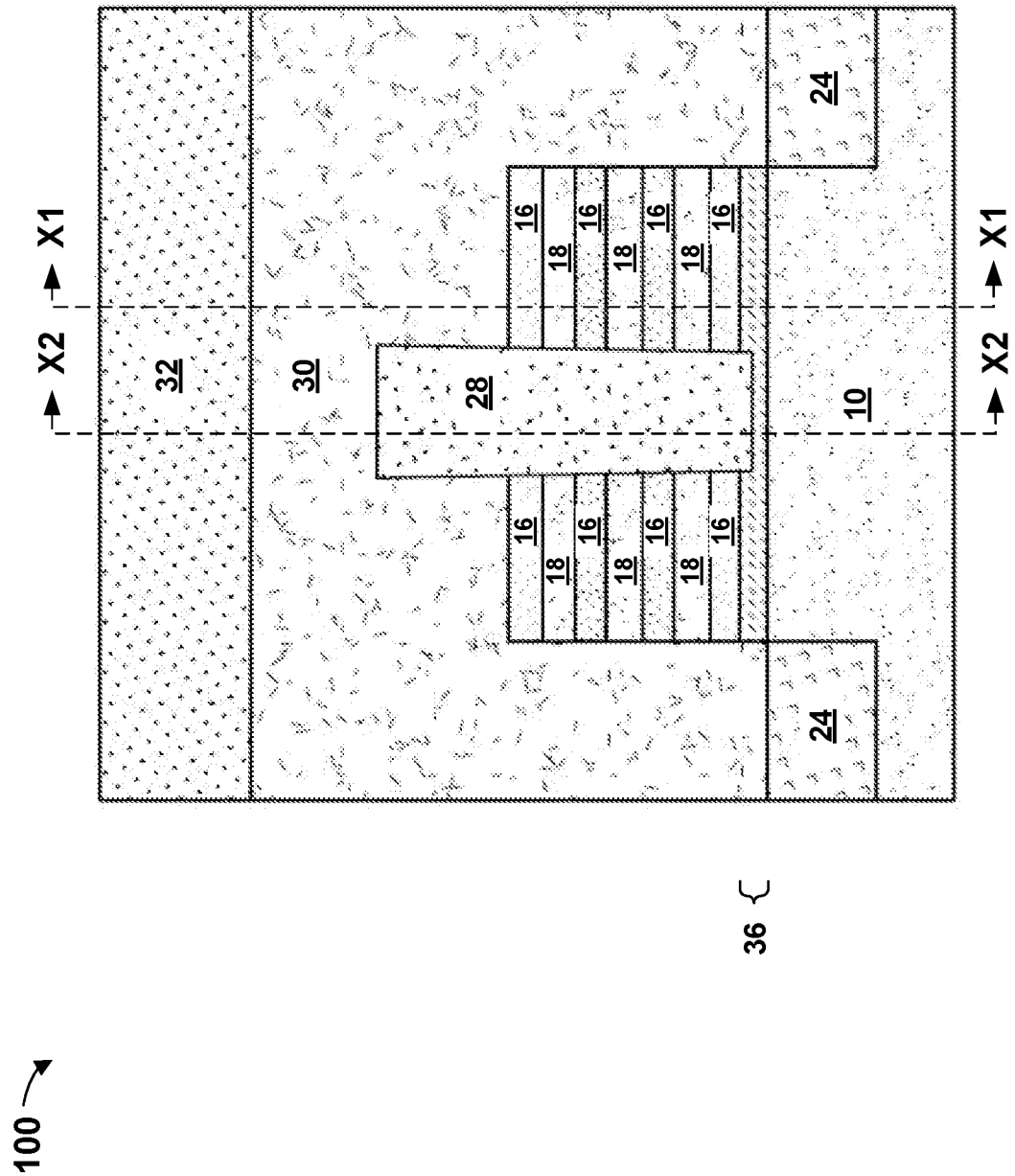

Referring now to FIGS. 14-16, the structure 100 is shown according to an exemplary embodiment. FIGS. 14 and 15 are each a cross-sectional view of the structure 100 along section lines X1-X1 and X2-X2, respectively and are parallel to each other. FIG. 16 is a cross-sectional view of the structure 100 along section line Y-Y and is perpendicular to section lines X1-X1 and X2-X2.

As shown in FIGS. 14-16, a sacrificial gate 30 and a gate hard mask 32 may be formed. The stack sacrificial layer 12 may be removed. An isolation layer 36 and a side spacer 34 may be formed.

The sacrificial gate 30 may include a single sacrificial material or a stack of one or more sacrificial materials. The at least one sacrificial material can be formed by forming a blanket layer (or layers) of a material (or various materials) and then patterning the material (or various materials) by lithography and an etch. The sacrificial gate 30 can include any material including, for example, polysilicon, amorphous silicon, or multilayered combinations thereof. The sacrificial gate 30 can be formed using any deposition technique including, for example, chemical vapor deposition (CVD), physical vapor deposition (PVD), high density plasma (HDP) deposition, and spin on techniques. Optionally, a gate dielectric layer and a gate cap may be formed as part of the sacrificial gate 30 in accordance with known techniques. As shown in FIGS. 14 and 15, there are three sacrificial gates 30. In an embodiment, there may be any number of sacrificial gates 30 formed.

In an embodiment, the sacrificial gate 30 is deposited with a thickness sufficient to fill, or substantially fill, the spaces between adjacent nanosheet structures as shown in FIG. 16 and cover an upper surface and exposed side surfaces of the dielectric 28 and cover an upper surface of the uppermost sacrificial layer 16 of the nanosheet stack. The sacrificial gate 30 may be adjacent to vertical side surfaces of the nanosheet stack, including vertical side surfaces of the stack sacrificial layer 12, the channel layers 18 and the stack sacrificial layers 16. A height of the sacrificial gate 30 may be much thicker than the underlying structure and may have a height between 100 nm and 150 nm about the nanosheet stack.

The gate hard mask 32 may be formed over a horizontal upper surface of the sacrificial gate 30, by methods known in the art. The gate hard mask 32 may have vertical side surfaces which align with vertical side surfaces of the sacrificial gate 30.

The stack sacrificial layer 12 may be removed selective to the sacrificial layers 16, the channel layers 18, the dielectric 28, the sacrificial gate 30 and the gate hard mask 32. For example, a dry etching technique can be used to selectively remove the stack sacrificial layer 12, such as, for example, using vapor phased HCl dry etch.

The isolation layer 36 and the side spacer 34 may be formed. The isolation layer 36 may be formed in an opening, not shown, where the stack sacrificial layer 12 has been removed. The isolation layer 36 may be formed between the bottom most sacrificial layer 16 of the nanosheet stack and the substrate 10 and between the dielectric 28 and the substrate 10. The side spacer 34 may be formed on either side of the sacrificial gate 30 and the gate hard mask 32.

The isolation layer 36 and the side spacer 34 may each be formed after several processes, including for example, conformally depositing or growing a dielectric and performing an anisotropic etch process. The isolation layer 36 and the side spacer 34 may include any dielectric material such as silicon nitride and may include a single layer or may include multiple layers of dielectric material. In an embodiment, the isolation layer 36 and the side spacer 34 may be the same material. The isolation layer 36 and the side spacer 34 may be formed simultaneously or may be formed separately.

Figures 17, 18:
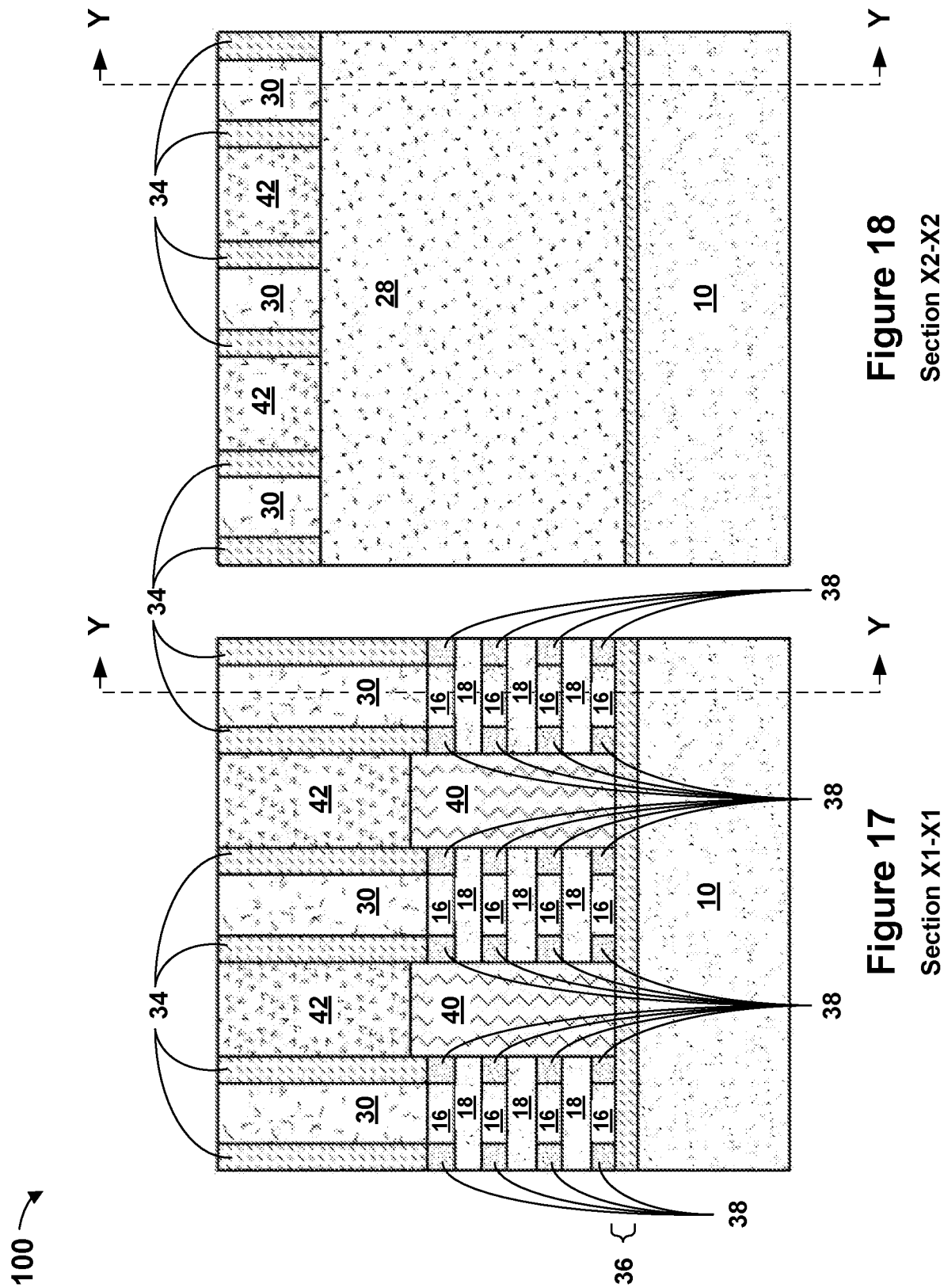
FIGS. 17, 18 and 19 each illustrate a cross-sectional view of the of the semiconductor structure along sections X1-X1, X2-X2 and Y-Y, respectively, and illustrates formation of an inner spacer, according to an exemplary embodiment.
Figure 19:
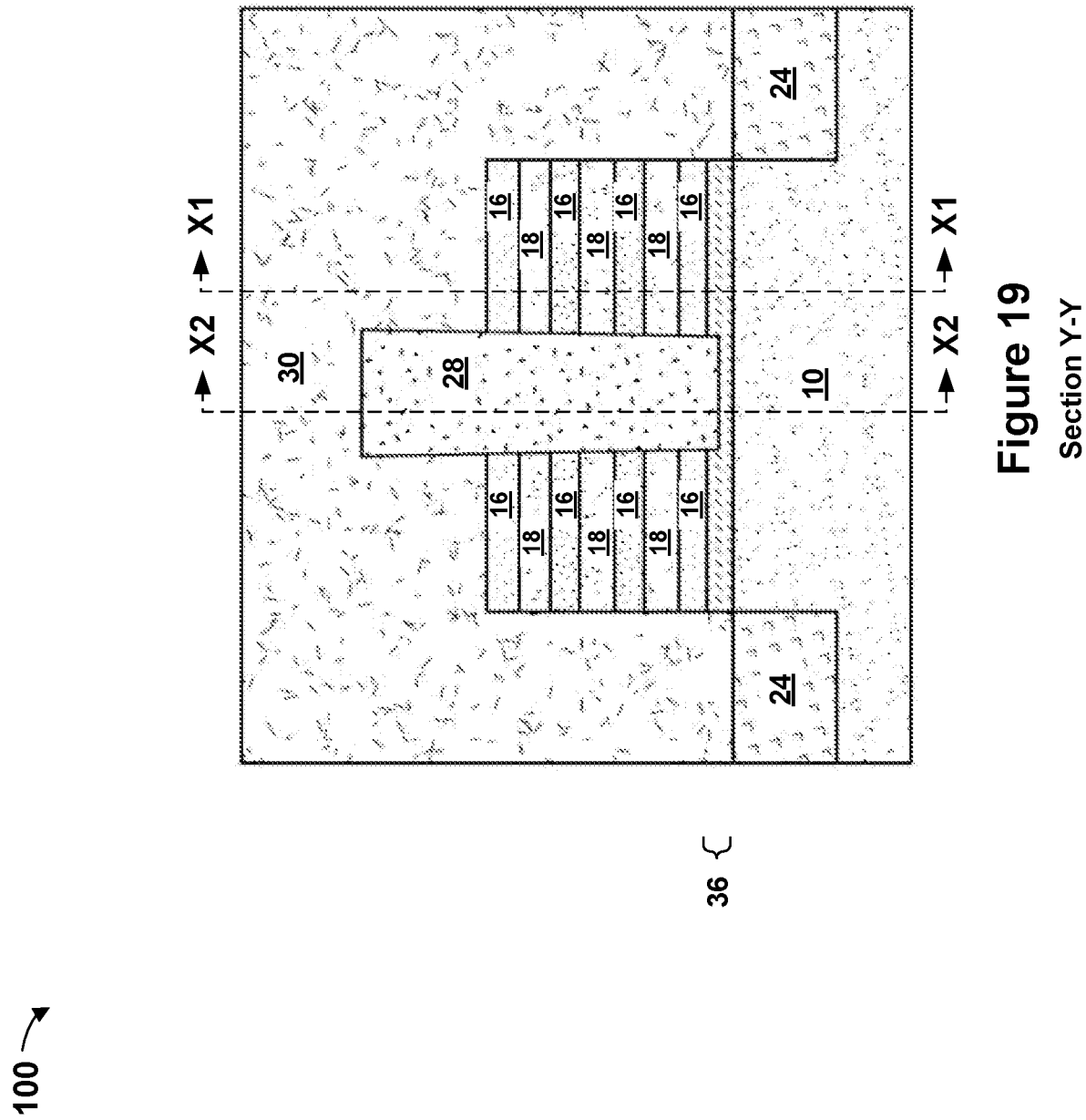

Referring now to FIGS. 17-19, the structure 100 is shown according to an exemplary embodiment. FIGS. 17 and 18 are each a cross-sectional view of the structure 100 along section lines X1-X1 and X2-X2, respectively and are parallel to each other. FIG. 19 is a cross-sectional view of the structure 100 along section line Y-Y and is perpendicular to section lines X1-X1 and X2-X2.

As shown in FIGS. 17-19, a vertical portion of each nanosheet stack may be removed, a further portion of each of the sacrificial layers 16 and a lateral recessed portion of the dielectric 28 may be removed using methods known in the art. An inner spacer 38 may be formed on either side of the sacrificial layers 16. A source drain 40 may be formed where the vertical portion of each nanosheet stack was removed, and partially recessed. An inner layer dielectric (hereinafter "ILD") 42 may be formed above the source drain 40 The gate hard mask 32 may be removed.

The vertical portion of the nanosheet stack which is removed may be between two adjacent sacrificial gates 30, gate hard mask 32 and the side spacers 34 surrounding each sacrificial gate 30. The vertical portion of the nanosheet stack may be formed by removing a vertical portion of the nanosheet stack, including a portion of each of the channel layers 18 and a portion of each of the sacrificial layers 16.

The vertical portion of the nanosheet stack is removed from the nanosheet stack between adjacent sacrificial gates 30, gate hard mask 32, each with side spacers 34 surrounding the sacrificial gate 30 and the gate hard mask 32. The sacrificial gate 30, gate hard mask 32 and the side spacers 34 protect remaining portions of the nanosheet stack. The vertical portion of the nanosheet stack may be removed via etching using an anisotropic etching technique, such as, for example, reactive ion etching (RIE), and stopping at the isolation layer 36. As shown in FIGS. 17 and 18 there are two vertical portions of the nanosheet stack removed, however there may be any number of vertical portions removed in the structure 100.

A further portion of each of the sacrificial layers 16 on either side of where the vertical portion of the nanosheet stack was removed, may be recessed simultaneously along with a lateral recess of the dielectric 28, and a same amount of recessing may occur in both.

The inner spacer 38 may be formed on either side of the sacrificial layers 16. Outer vertical sides of the inner spacer may vertically align with the channel layers 18 and inner vertical sides of the inner spacer may vertically align with remaining portions of the sacrificial layers 16.

The inner spacer 38 may each be formed after several processes, including for example, conformally depositing or growing a dielectric and performing an anisotropic etch process. The inner spacer 38 may include any dielectric material such as silicon nitride and may include a single layer or may include multiple layers of dielectric material.

A source drain 40 may be formed where the vertical portion of the nanosheet stack was removed, and partially recessed using methods known in the art. An inner layer dielectric (hereinafter "ILD") 42 may be formed above the source drain 40.

The source drain 40 may be epitaxially grown in a region on between adjacent sacrificial gates 30, gate hard mask 32 and side spacers 34. The source drain 40 may be in direct contact with end portions of the channel layers 18 of the nanosheet stack and end portions of the inner spacer 38 surrounding the sacrificial layers 16. The source drain 40 may be formed over the isolation layer 36. A portion of the source drain 40 may be removed such that an upper surface of the source drain 40 is above the nanosheet stack and the ILD 42 may be formed above the source drain 40 between adjacent sacrificial gate 30, gate hard mask 32 and side spacers 34.

After forming the ILD 42, the gate hard mask 32, may be removed, for example, by a wet etching technique as described above, followed by a chemical mechanical polishing (CMP) technique to remove excess material and polish upper surfaces of the structure 100 until horizontal upper surfaces are coplanar for the sacrificial gate 30, side spacers 34 and ILD 42.

Referring now to FIGS. 20-22, the structure 100 is shown according to an exemplary embodiment. FIGS. 20 and 21 are each a cross-sectional view of the structure 100 along section lines X1-X1 and X2-X2, respectively and are parallel to each other. FIG. 22 is a cross-sectional view of the structure 100 along section line Y-Y and is perpendicular to section lines X1-X1 and X2-X2.

As shown in FIGS. 20-22, the sacrificial gate 30 may be removed, and the sacrificial layers 16 may be removed.

The sacrificial gate 30 may be removed by methods known in the art. sacrificial gate 30 may be removed selective to the side spacers 34 and the uppermost sacrificial layer 16 of the nanosheet stack.

The sacrificial material layers 16 are removed selective to the channel layers 18, the inner spacers 38, the dielectric 28 and the isolation layer 36. As illustrated in FIG. 20, the remaining channel layers 18 of the nanosheet stack are shown suspended and are supported on both ends by the source drain 40. For example, a dry etch process can be used to selectively remove the sacrificial layer 16, such as using vapor phased HCl dry etch.

Figure 25:
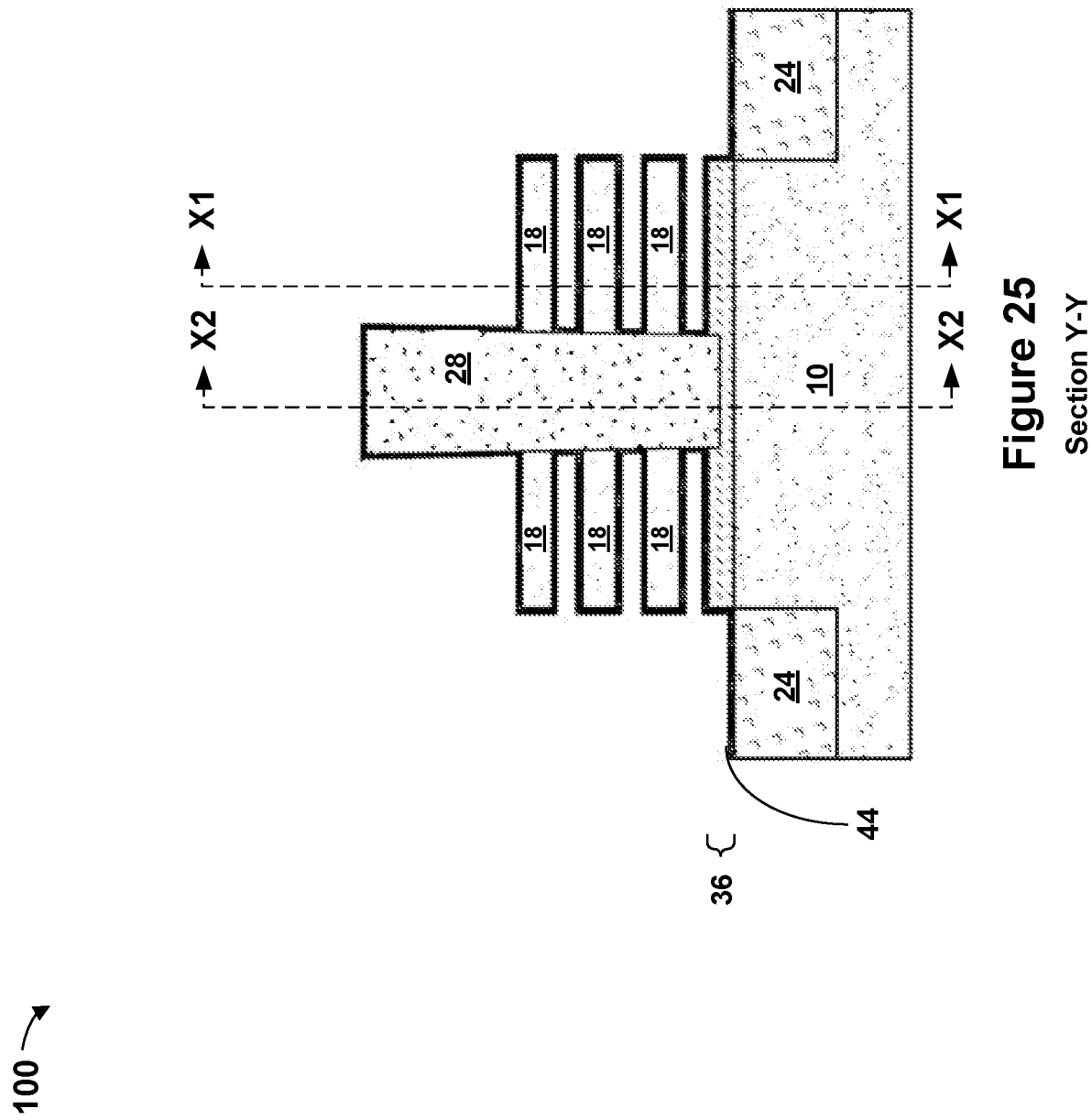

Referring now to FIGS. 23-25, the structure 100 is shown according to an exemplary embodiment. FIGS. 23 and 24 are each a cross-sectional view of the structure 100 along section lines X1-X1 and X2-X2, respectively and are parallel to each other. FIG. 25 is a cross-sectional view of the structure 100 along section line Y-Y and is perpendicular to section lines X1-X1 and X2-X2.

As shown in FIGS. 23-25, a high-k liner 44 may be formed. Materials for the high-k liner 44 may include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. The high-k liner 44 may be referred to as a gate dielectric 44. The high-k liner 44 may be formed on exposed surfaces of the structure 100. Chamfering may be done on the high-k liner 44 selective to the side spacer 34, the ILD 42, the channel layers 18 and the dielectric 28. The high-k liner 44 may surround openings where the sacrificial layers 16 were removed, along exposed portions of the isolation layer 36, exposed portions of upper and lower surfaces of the channel layer 18, exposed surfaces of the inner spacer 38 and along a portion of inner surfaces of the side spacer 34. As shown in FIG. 25, the high-k liner 44 may cover an upper horizontal surface of the STI 24. The high-k liner 44 may cover exposed horizontal and vertical surfaces of the dielectric 28.

Figure 28:
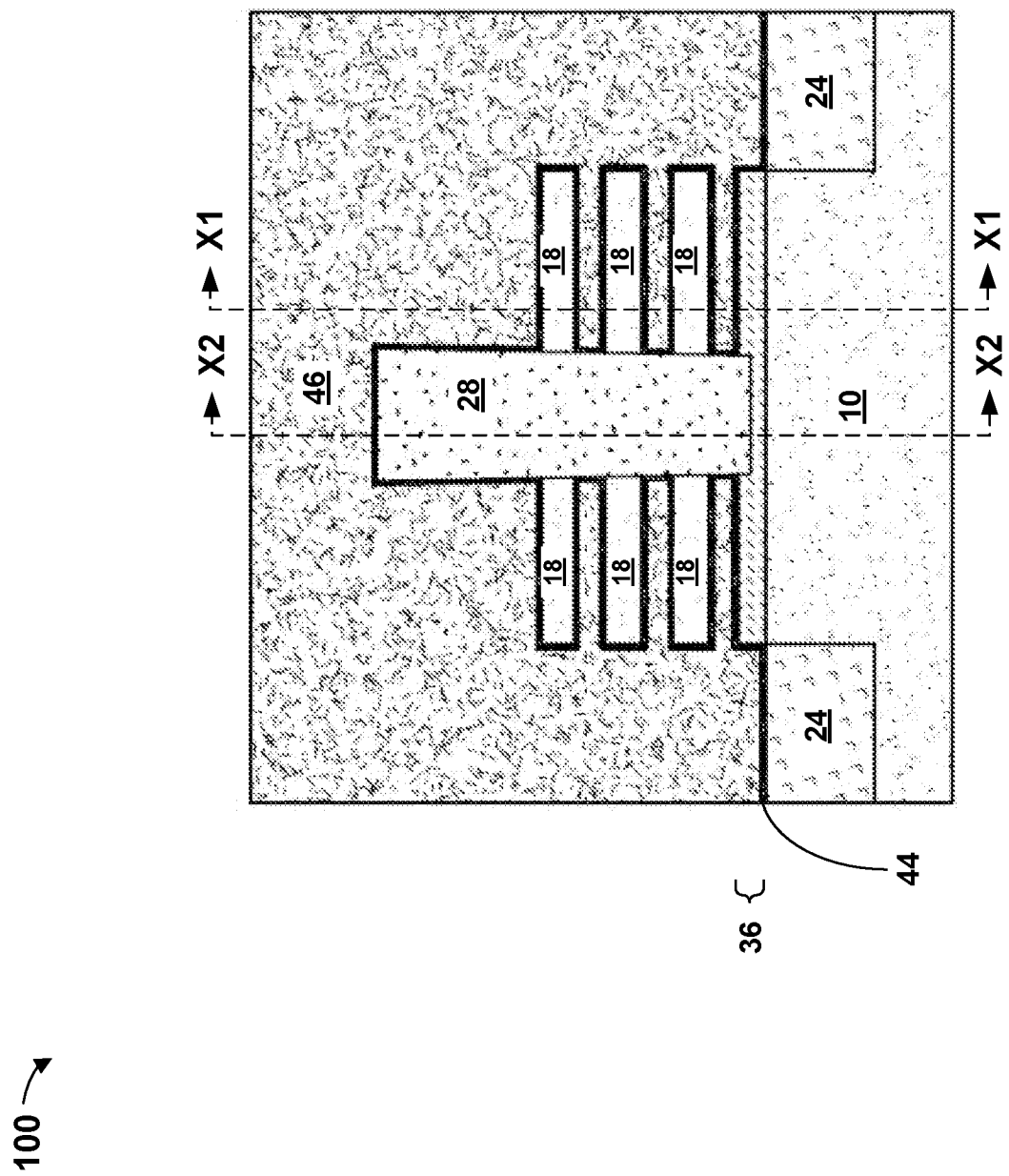

Referring now to FIGS. 26-28, the structure 100 is shown according to an exemplary embodiment. FIGS. 26 and 27 are each a cross-sectional view of the structure 100 along section lines X1-X1 and X2-X2, respectively and are parallel to each other. FIG. 28 is a cross-sectional view of the structure 100 along section line Y-Y and is perpendicular to section lines X1-X1 and X2-X2.

As shown in FIGS. 26-28, a work function metal (hereinafter "WFM") 46 may be formed. The WFM 46 may be conformally formed on the structure 100, according to an exemplary embodiment. The WFM 46 is formed in each cavity of the nanosheet stack and surrounding suspended portions of the channel layers 18.

The WFM 46 forms a layer surrounding exposed portions of the nanosheet stacks. The WFM 46 may cover an exposed portion of the STI 24, exposed surfaces between the side spacers 34 over the nanosheet stack and exposed surfaces of the dielectric 28. The WFM 46 may fill a remainder of openings where the sacrificial layers 16 were removed, within the high-k liner 44. The WFM 46 may fill a remainder of openings where the sacrificial gate 30 was removed between side spacers 34 over the nanosheet stack, with the high k liner 44 between the WFM 46 and a portion of the side spacer 34 above the nanosheet stack.

The WFM 46 may be deposited using typical deposition techniques, for example, atomic layer deposition (ALD), molecular layer deposition (MLD), and chemical vapor deposition (CVD). The material chosen for the WFM 46, and the high-k liner 44, may be selected based on a desired threshold voltage, in combination with other materials and properties as described above, for the nanosheet stack, where the WFM 46 surrounds the channel layers 18, and whether the device is a p-FET or n-FET. In an embodiment, the work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics.

After forming the WFM 46, a chemical mechanical polishing (CMP) technique may be used to remove excess material and polish upper surfaces of the structure 100 such that upper horizontal surfaces of the WFM 46, the side spacers 34 and the ILD 42 are coplanar.

Referring now to FIGS. 29-31, the structure 100 is shown according to an exemplary embodiment. FIGS. 29 and 30 are each a cross-sectional view of the structure 100 along section lines X1-X1 and X2-X2, respectively and are parallel to each other. FIG. 31 is a cross-sectional view of the structure 100 along section line Y-Y and is perpendicular to section lines X1-X1 and X2-X2.

As shown in FIGS. 29-31, the WFM 46 may be recessed using methods known in the art, selective to the dielectric 28, the side spacers 34 and the ILD 42. A portion of the high-k liner 44 may be removed along an upper surface of the dielectric 28, exposing the dielectric 28, as shown in FIG. 31.

Figures 32, 33:
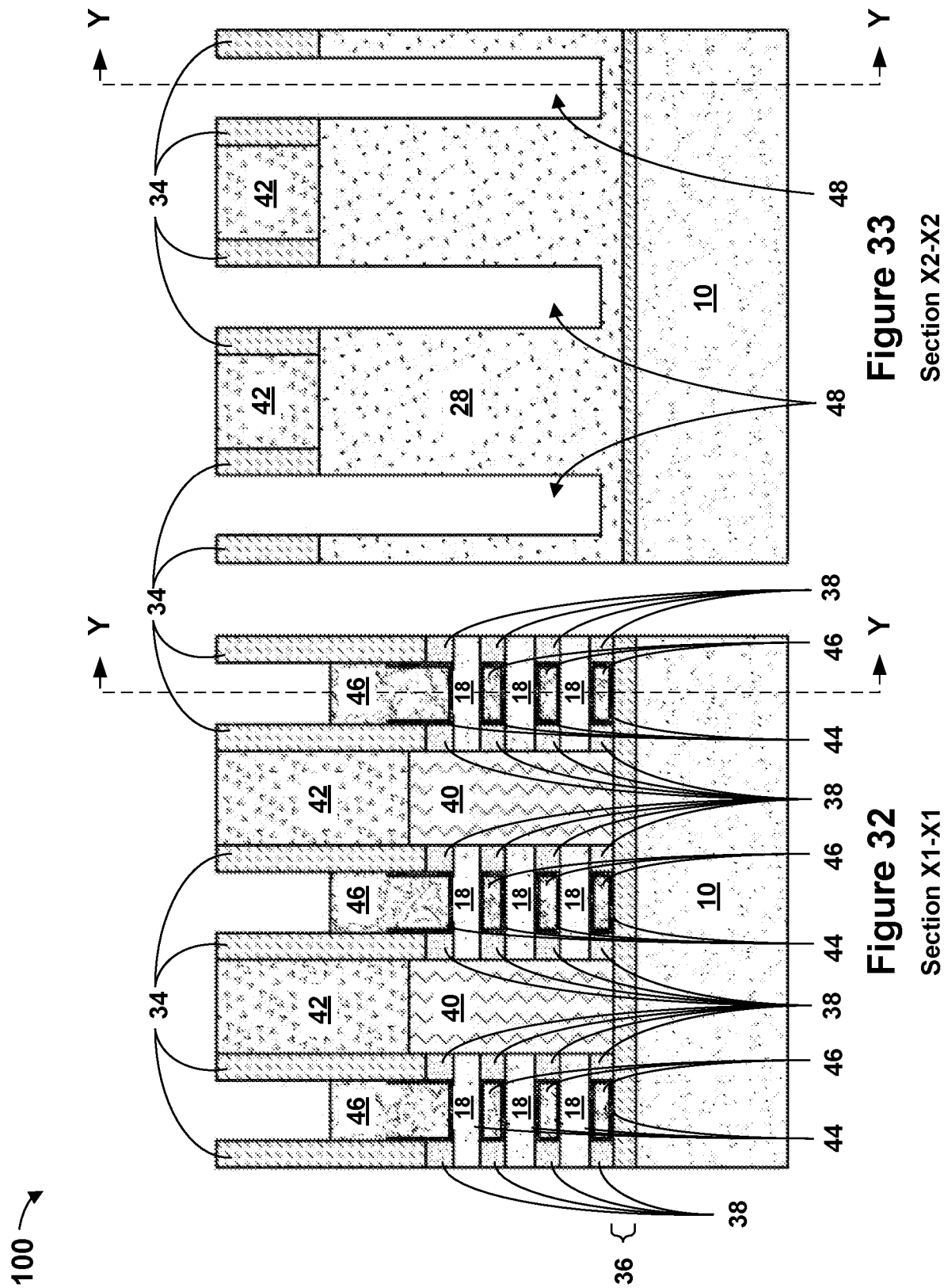
FIGS. 32, 33 and 34 each illustrate a cross-sectional view of the of the semiconductor FIGS. 32, 33 and 34 each illustrate a cross-sectional view of the of the semiconductor structure along sections X1-X1, X2-X2 and Y-Y, respectively, and illustrates partial removal of the dielectric, according to an exemplary embodiment.
Figure 34:
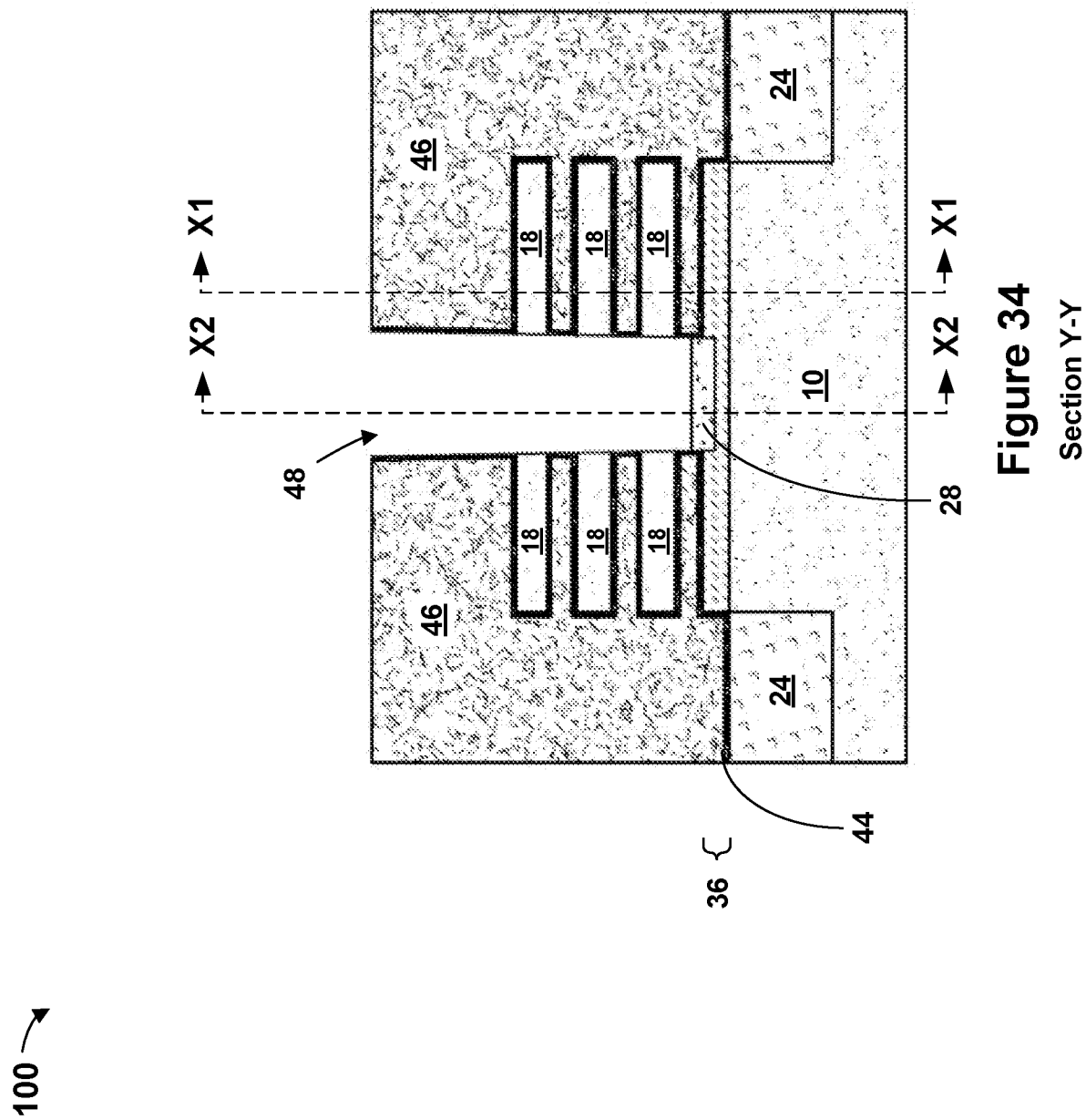

Referring now to FIGS. 32-34, the structure 100 is shown according to an exemplary embodiment. FIGS. 32 and 33 are each a cross-sectional view of the structure 100 along section lines X1-X1 and X2-X2, respectively and are parallel to each other. FIG. 34 is a cross-sectional view of the structure 100 along section line Y-Y and is perpendicular to section lines X1-X1 and X2-X2.

As shown in FIGS. 32-34, a portion of the high K liner 44 may be removed and openings 48 may be formed in the dielectric 28. Portions of the dielectric 28 may be removed to form the openings 48 using an anisotropic etching technique, such as, for example, reactive ion etching (RIE). The openings 48 may be formed between the side spacers 34 and ILD 42. Three openings 48 are shown, however any number of openings may be formed between adjacent rows of gates. A portion of the dielectric 28 may remain at a lower horizontal surface of each of the openings 48. Opposite vertical side surfaces of each of the openings 48 may include a vertical side surface of the dielectric 28 and a vertical side surface of a side spacer 34. Alternate opposite vertical side surfaces of each of the openings 48 may include vertical side surfaces of each of the channel layer 18 of the nanosheet stack and the high-k liner 44, separating portions of vertical side surfaces of the WFM 46 between the channel layers 18, above the nanosheet stack, and between the lowermost channel layer 18 and the isolation layer 36.

Figures 35, 36:
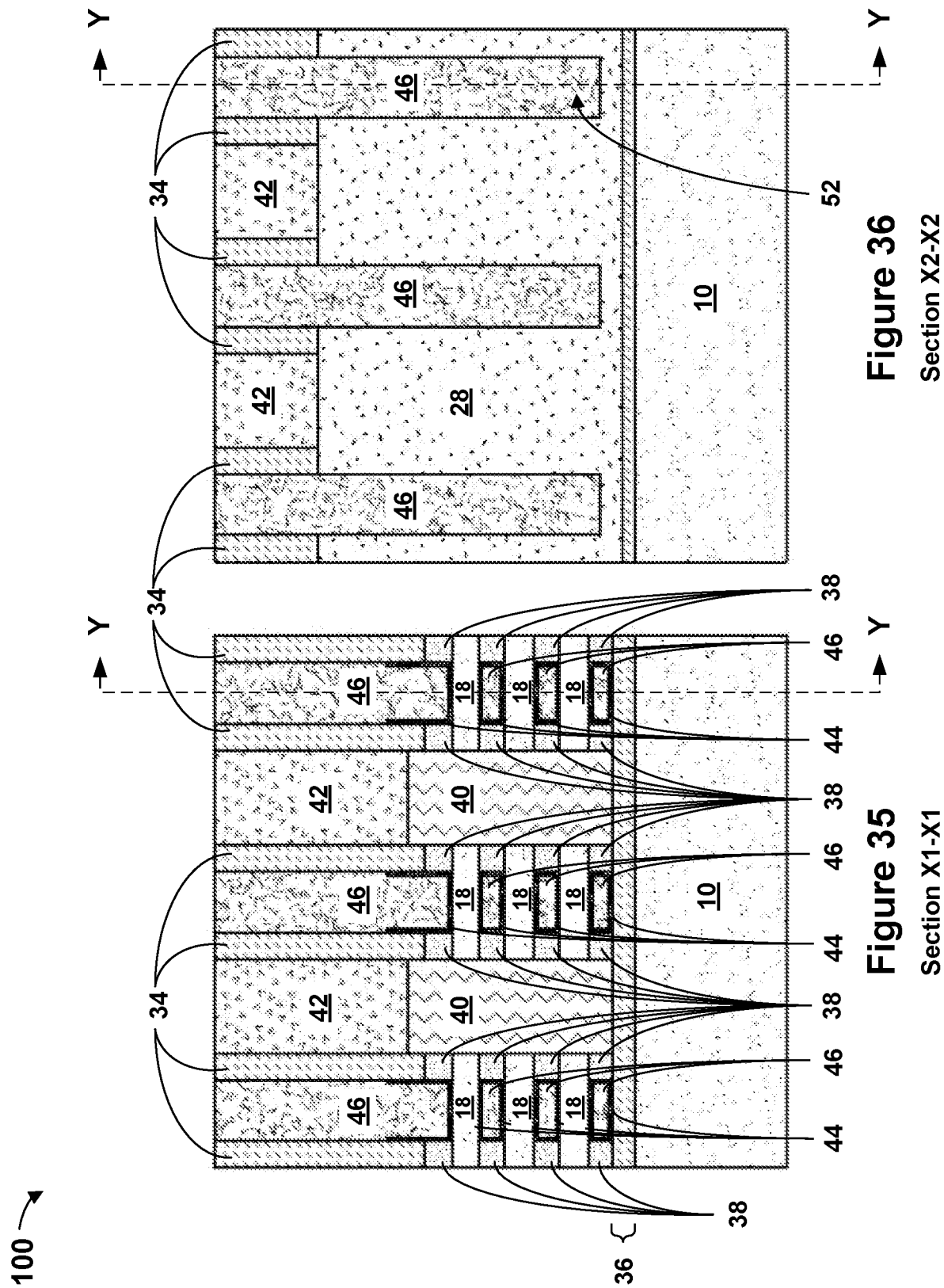
FIGS. 35, 36 and 37 each illustrate a cross-sectional view of the of the semiconductor structure along sections X1-X1, X2-X2 and Y-Y, respectively, and illustrates formation of additional work function metal material, according to an exemplary embodiment.
Figure 37:
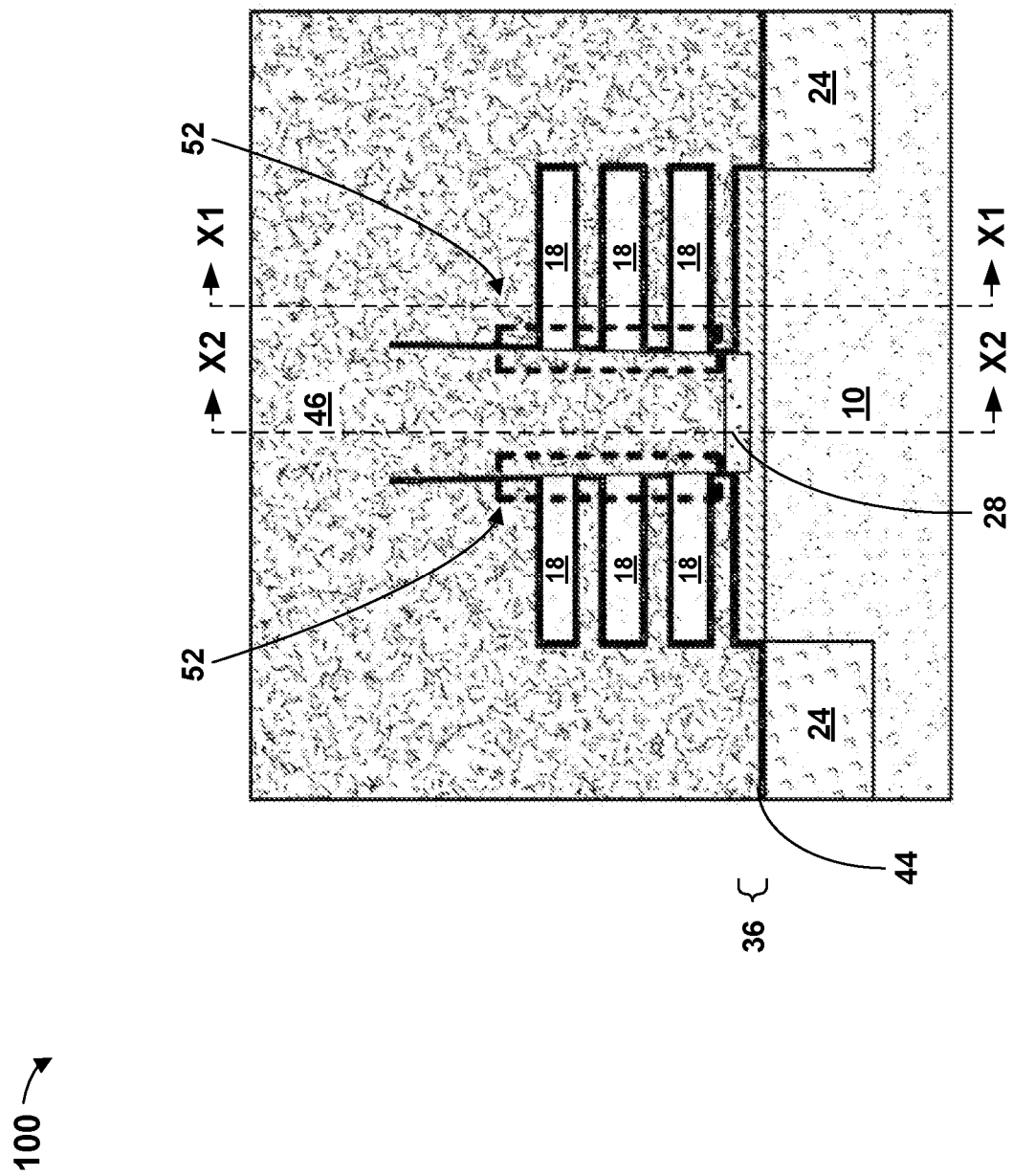

Referring now to FIGS. 35-37, the structure 100 is shown according to an exemplary embodiment. FIGS. 35 and 36 are each a cross-sectional view of the structure 100 along section lines X1-X1 and X2-X2, respectively and are parallel to each other. FIG. 37 is a cross-sectional view of the structure 100 along section line Y-Y and is perpendicular to section lines X1-X1 and X2-X2.

As shown in FIGS. 35-37, additional formation of the WFM 46 may be deposited as described above. The WFM 46 may be deposited in each of the openings 48 and in the gate. Vertical side surfaces of the WFM 46 may be adjacent to the vertical side surface of the dielectric 28 and the vertical side surface of the side spacers 34. Alternate vertical side surfaces of each of the WFM 46 may include vertical side surfaces of each of the channel layers 18 of the nanosheet stack and the high-k liner 44, separating portions of vertical side surfaces of the WFM 46 between the channel layers 18, above the nanosheet stack, and between the lowermost channel layer 18 and the isolation layer 36.

After forming the WFM 46, a chemical mechanical polishing (CMP) technique may be used to remove excess material and polish upper surfaces of the structure 100 such that upper horizontal surfaces of the WFM 46, the side spacers 34 and the ILD 42 are coplanar.

As shown in FIG. 37, the portion of the WFM 46 formed in the openings 48 directly contacts vertical sidewalls of the channel layers 18 as identified by a region 52. Within the region 52 an area within the nanosheet stack provides an increased contact area between the WFM 46 and the channel layers 18. As such, a gate of the nanosheet device directly contacts sidewalls of the channel layers 18. Stated differently, the WFM 46 directly contacts sidewalls of each of the channel layers 18 without the high-k liner 44. This direct contact may be referred to as body contact due to the fact the WFM/gate contacts the body of the channel.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor nanosheet device comprising:
   semiconductor channel layers vertically aligned and stacked one on top of another, the semiconductor channel layers separated from each other by a work function metal; and
   a gate dielectric layer partially surrounding each of the semiconductor channel layers and physically separating the work function metal from each of the semiconductor channel layers, wherein a first portion of the work function metal directly contacts a vertical sidewall of each of the semiconductor channel layers.

2. The semiconductor nanosheet device according to claim 1, wherein
   a portion of the gate dielectric layer extends vertically above the semiconductor channel layers separating the first portion of the work function metal and a second portion of the work function metal immediately above an uppermost semiconductor channel layer.

3. The semiconductor nanosheet device according to claim 1, wherein
   the gate dielectric layer extends vertically below the semiconductor channel layers separating the first portion of the work function metal and a second portion of the work function metal immediately below a lowermost semiconductor channel layer of the semiconductor channel layers.

4. The semiconductor nanosheet device according to claim 1, wherein
   the gate dielectric layer extends vertically between each of the semiconductor channel layers separating the first portion of the work function metal from a second portion of the work function metal positioned between two adjacent semiconductor channel layers.

5. The semiconductor nanosheet device according to claim 1, further comprising:
   source drain regions extending laterally from opposite ends of the semiconductor channel layers.

6. A semiconductor device comprising:
   a first set of semiconductor channel layers vertically aligned and stacked one on top of another separated by a work function metal;
   a second set of semiconductor channel layers adjacent to the first set of semiconductor channel layers, the second set of semiconductor channel layers are vertically aligned and stacked one on top of another separated by the work function metal; and a gate dielectric layer partially surrounding each of the semiconductor channel layers and physically separating the work function metal from each of the semiconductor channel layers of both the first set and the second set of semiconductor channel layers, wherein a first portion of the work function metal between the first set of semiconductor channel layers and the second set of semiconductor channel layers directly contacts a sidewall of each of the semiconductor channel layers of both the first set and the second set of semiconductor channel layers.

7. The semiconductor device according to claim 6, wherein a first portion of the gate dielectric layer extends vertically above the first set of semiconductor channel layers, separating the first portion of the work function metal and a second portion of the work function metal immediately above an uppermost semiconductor channel layer of the first set of semiconductor channel layers, wherein a second portion of the gate dielectric layer extends vertically above the second set of semiconductor channel layers, separating the first portion of the work function metal and a third portion of the work function metal immediately above an uppermost semiconductor channel layer of the second set of semiconductor channel layers.

8. The semiconductor device according to claim 6, wherein the gate dielectric layer extends vertically below the first set of semiconductor channel layers, separating the first portion of the work function metal and a second portion of the work function metal immediately below a lowermost semiconductor channel layer of the first set of semiconductor channel layers, wherein the gate dielectric layer extends vertically below the second set of semiconductor channel layers, separating the first portion of the work function metal and a third portion of the work function metal immediately below a lowermost semiconductor channel layer of the second set of semiconductor channel layers.

9. The semiconductor device according to claim 6, wherein a second portion of the gate dielectric separates the first portion of the work function metal from a second portion of the work function metal, wherein the second portion of the work function metal is positioned between two adjacent layers of the first set of semiconductor channel layers, and wherein a third portion of the gate dielectric separates the first portion of the work function metal from a third portion of the work function metal, wherein the third portion of the work function metal is positioned between two adjacent layers of the second set of semiconductor channel layers.

10. The semiconductor device according to claim 6, further comprising:

source drain regions extending laterally from opposite ends of the first set of semiconductor channel layers; and source drain regions extending laterally from opposite ends of the second set of semiconductor channel layers.

11. A method comprising:

forming an initial stack of nanosheet layers on a substrate, the initial stack of nanosheet layers comprising alternating layers of a sacrificial and a semiconductor channel vertically aligned and stacked one on top of another;

forming a vertical opening along a length of the initial stack of nanosheet layers creating a first stack of nanosheet layers and a second stack of nanosheet layers, the vertical opening exposing vertical side surfaces of the alternating sacrificial layers and the semiconductor channel layers of both the first stack and the second stack;

forming a dielectric in the vertical opening;

forming a sacrificial gate across both the first stack and the second stack of nanosheet layers;

forming source drain regions extending laterally from either end of the semiconductor channel layers of the first stack and of the second stack of nanosheet layers;

removing the sacrificial gate;

removing the sacrificial layers of the first stack and of the second stack;

forming a gate dielectric surrounding openings where the sacrificial layers of the first stack and of the second stack were removed, and on exposed surfaces of the dielectric;

forming a work function metal conformally, wherein the work function metal fills remaining openings where the sacrificial layers of the first stack and of the second stack were removed; and recessing the work function metal, wherein a portion of the gate dielectric on an upper horizontal surface of the dielectric is exposed.

12. The method according to claim 11, further comprising:

removing the exposed portion of the gate dielectric from the upper horizontal surface of the dielectric.

13. The method according to claim 12, further comprising:

forming a vertical opening in the dielectric, exposing a second vertical side surface of the first stack and a first vertical side surface of the second stack.

14. The method according to claim 13, further comprising:

forming additional work function metal in the vertical opening of the dielectric, wherein the second vertical side surface of each of the semiconductor channel layer of the first stack contacts the work function metal without the gate dielectric layer between the semiconductor channel layer and the work function metal, wherein the first vertical surface of each of the semiconductor channel layer contacts of the second stack contacts the work function metal without the gate dielectric layer between the semiconductor channel layer and the work function metal.

* * * * *